United States Patent
Irons et al.

(10) Patent No.: US 10,517,188 B2
(45) Date of Patent: Dec. 24, 2019

(54) POWER DISTRIBUTION UNIT WITH CORD STORAGE CARTRIDGE

(71) Applicant: Server Technology, Inc., Reno, NV (US)

(72) Inventors: Travis Irons, Reno, NV (US); Vimal Bhakta, Reno, NV (US); Jeff Macedo, Sparks, NV (US)

(73) Assignee: Server Technology, Inc., Reno, NV (US)

( * ) Notice: Subject to any disclaimer, the term of this patent is extended or adjusted under 35 U.S.C. 154(b) by 0 days.

(21) Appl. No.: 15/169,940

(22) Filed: Jun. 1, 2016

(65) Prior Publication Data

US 2017/0354056 A1     Dec. 7, 2017

(51) Int. Cl.
    *H05K 7/14*     (2006.01)
    *H01R 13/60*     (2006.01)
    *H01R 24/30*     (2011.01)
    *H01R 103/00*     (2006.01)

(52) U.S. Cl.
    CPC ........... *H05K 7/1491* (2013.01); *H01R 13/60* (2013.01); *H01R 24/30* (2013.01); *H05K 7/1492* (2013.01); *H01R 2103/00* (2013.01)

(58) Field of Classification Search
CPC ............................. H05K 7/1491; H01R 25/165
See application file for complete search history.

(56) References Cited

U.S. PATENT DOCUMENTS

| | | | |
|---|---|---|---|
| 5,913,487 A * | 6/1999 | Leatherman | H02G 11/02 191/12.2 R |
| 6,077,108 A * | 6/2000 | Lorscheider | B65H 75/44 439/4 |
| 7,043,543 B2 | 5/2006 | Ewing et al. | |
| 7,365,964 B2 * | 4/2008 | Donahue, IV | H01R 13/514 174/50 |
| 7,905,749 B2 * | 3/2011 | Cleveland | H01R 13/68 439/535 |
| 7,990,689 B2 | 8/2011 | Ewing et al. | |
| 8,004,827 B2 | 8/2011 | Ewing et al. | |
| 8,305,737 B2 | 11/2012 | Ewing et al. | |
| 8,321,163 B2 | 11/2012 | Ewing et al. | |
| 8,494,661 B2 | 7/2013 | Ewing et al. | |
| 8,541,906 B2 | 9/2013 | Ewing et al. | |
| 8,587,950 B2 * | 11/2013 | Ewing | H01R 25/006 174/261 |

(Continued)

*Primary Examiner* — William H. Mayo, III
*Assistant Examiner* — Hiram E Gonzalez
(74) *Attorney, Agent, or Firm* — Perkins Coie LLP

(57) ABSTRACT

Systems, methods, and devices are provided in which cord storage cartridges are removably connected to a power distribution unit (PDU). The cord storage cartridge may include a cartridge housing having at least one aperture, a PDU interface associated with the cartridge housing and configured to removably connect the cord storage device to a mateable interface of the PDU, and a power output cord having a proximal end in electrical communication with the PDU interface and a distal end coupled with an output connector that is configured to connect to electronic equipment. The power output cord may be stowed at least partially within the cartridge housing in a retracted state and moveable through the at least one aperture to an extended state at least partially external to the cartridge housing.

24 Claims, 24 Drawing Sheets

(56) References Cited

U.S. PATENT DOCUMENTS

| | | | | |
|---|---|---|---|---|
| 8,876,548 B2* | 11/2014 | Doorhy | ............... | H01R 25/006 174/53 |
| 2008/0093927 A1* | 4/2008 | Ewing | ................. | H05K 7/1492 307/23 |

* cited by examiner

POWER DISTRIBUTION UNIT WITH CORD STORAGE CARTRIDGE

TECHNICAL FIELD

The present disclosure is directed to power distribution devices and, more specifically, to a power distribution unit having adjustable cord storage capabilities. Even more particularly, the present disclosure is directed to cabinet power distribution units (CDUs) in a vertical form factor which incorporate removable and interchangeable cord storage cartridges.

BACKGROUND

A conventional Power Distribution Unit (PDU) is an assembly of electrical outlets (also called receptacles) that receive electrical power from a source and distribute the electrical power to one or more separate pieces of electronic equipment. Each such PDU assembly has a power input that receives power from a power source, and power outputs that may be used to provide power to one or more pieces of electronic equipment. PDUs are used in many applications and settings such as, for example, in or on electronic equipment racks. One or more PDUs are commonly located in an equipment rack (or other cabinet), and may be installed together with other devices connected to the PDU such as environmental monitors, temperature and humidity sensors, fuse modules, or communications modules that may be external to or contained within the PDU housing. A PDU that is mountable in an equipment rack or cabinet may sometimes be referred to as a Cabinet PDU, or "CDU" for short.

A common use of PDUs is supplying operating power for electrical equipment in computing facilities, such as data centers or server farms. Such computing facilities may include electronic equipment racks that comprise rectangular or box-shaped housings sometimes referred to as a cabinet or a rack and associated components for mounting equipment, associated communications cables, and associated power distribution cables. Electronic equipment may be mounted in such racks so that the various electronic devices (e.g., network switches, routers, servers and the like) are aligned vertically, one on top of the other, in the rack. One or more PDUs may be used to provide power to the electronic equipment. Multiple racks may be oriented side-by-side, with each containing numerous electronic components and having substantial quantities of associated component wiring located both within and outside of the area occupied by the racks.

As mentioned, many equipment racks may be located in a data center or server farm, each rack having one or more associated PDUs. Various different equipment racks may have different configurations, including different locations of and different densities of equipment within racks. As will be readily recognized, space within equipment racks is valuable with maximization of computing resources for any given volume being desirable.

SUMMARY

The evolution of computing equipment is toward higher electrical efficiency and smaller volume, resulting in higher densities of computing equipment within a rack that require an equivocal number of power outputs. For this reason, a PDU that provides the equivocal number of power outputs while also reducing the area occupied by the associated power distribution cables is commercially advantageous.

Apparatuses, devices, and methods are provided in the present disclosure that allow for a variable number of power outputs in a PDU, while also providing variable lengths of power output cords. In some aspects, a PDU includes a PDU housing, a power input coupled with the PDU housing and connectable to an external power source, and at least one cord storage cartridge removably connected to the PDU and in electrical communication with the power input.

In some examples, the PDU includes at least one cartridge interface associated with the PDU housing and configured to removably connect the cord storage cartridge to the PDU. In some examples, the at least one cartridge interface is further configured to electrically interconnect the at least one cord storage cartridge to the power input.

In some examples, the at least one cartridge interface includes at least one first power connector in electrical communication with a first power line from the power input; and at least one second power connector in electrical communication with a second power line from the power input. In some examples, the first power line is a first phase power line from the power input, and the second power line is a neutral line from the power input. In some examples, the power input is a polyphase power input, the first power line is a first phase power line from the polyphase power input, and the second power line is a second phase power line from the polyphase power input.

In some examples, the at least one cartridge interface includes at least one communication signal interface configured to receive at least one power-related parameter from the at least one cord storage cartridge. In some examples, the at least one communication signal interface includes an electrical signal interface, an optical signal interface, a radio frequency signal interface, or a combination thereof. In some examples, the at least one cord storage cartridge includes at least one sensing device configured to sense the at least one power-related parameter. In some examples, the PDU includes at least one communications bus in communication with the at least one communication signal interface and at least one communications module in communication with the at least one communications bus and configured to report the at least one power-related parameter to a network.

In some examples, the at least one cartridge interface includes at least one control signal interface configured to provide control signals to the at least one cord storage cartridge. In some examples, the at least one control signal interface includes an electrical signal interface, an optical signal interface, a radio frequency signal interface, or a combination thereof. In some examples, the control signals control the operation of the at least one cord storage cartridge. In some examples, the at least one cord storage cartridge comprises at least one relay and the control signals control the operation of the at least one relay.

In some examples, the PDU includes a channel longitudinally associated with the PDU housing. The at least one cartridge interface may be disposed within the channel. In some examples, the channel includes a sidewall having at least one alignment notch configured to guide the at least one cord storage cartridge into registration with the at least one cartridge interface.

In some examples, the PDU includes a plurality of cartridge interfaces associated with the PDU housing and configured to removably connect a plurality of cord storage cartridges to the PDU. In some examples, the plurality of cord storage cartridges are disposed adjacent to each other along a substantial length of the PDU housing. In some examples, each of the plurality of cord storage cartridges comprises a power output cord having a proximal end in electrical communication with the power input and a distal end coupled with an output connector that is configured to connect to electronic equipment. In some examples, two or more of the plurality of cord storage cartridges comprise power output cords having different types of output connectors configured to connect to corresponding types of electronic equipment. In some examples, two or more of the plurality of cord storage cartridges are interchangeable.

In some examples, the PDU includes at least one cartridge attachment structure associated with the PDU housing and at least one PDU attachment mechanism associated with the at least one cord storage cartridge and configured to mateably engage with the at least one cartridge attachment structure. In some examples, the at least one cartridge attachment structure includes a post and the at least one PDU attachment mechanism includes a notch configured to receive the post.

In some aspects, a cord storage device may include a cartridge housing having at least one aperture, a PDU interface associated with the cartridge housing and configured to removably connect the cord storage device to a mateable interface of a PDU, and a power output cord having a proximal end in electrical communication with the PDU interface and a distal end coupled with an output connector that is configured to connect to electronic equipment. The power output cord may be stowed at least partially within the cartridge housing in a retracted state and moveable through the at least one aperture to an extended state at least partially external to the cartridge housing.

In some examples, the cord storage device includes at least one attachment mechanism associated with the cartridge housing and movable from a secured state, in which the attachment mechanism can retainably couple the cord storage device to the PDU, to an unsecured state to allow removal of the cord storage device from the PDU. In some examples, the at least one attachment mechanism includes a notch configured to receive a post associated with the PDU. In some examples, the at least one attachment mechanism is movable from the secured state to the unsecured state by sliding the at least one attachment mechanism relative to the cartridge housing. In some examples, the at least one attachment mechanism includes a locking mechanism configured to prevent the at least one attachment mechanism from moving from the secured state to the unsecured state.

In some examples, the cord storage device includes at least one printed circuit board (PCB) having the PDU interface mounted thereon. In some examples, the at least one aperture is configured to permit the power output cord to extend through the at least one aperture at different angles. In some examples, the power output cord is capable of extending from the at least one aperture at a user-defined distance to connect to the electronic equipment. In some examples, the power output cord in the retracted state is configured to be stowed at least partially within the cartridge housing in a serpentine orientation. In some examples, the power output cord is pre-conditioned to return to the serpentine orientation when moved towards the retracted state. In some examples, the cord storage device includes at least one alignment tab associated with the cartridge housing and configured to guide the cord storage device to the mateable interface of the PDU.

In some examples, the cord storage device includes at least one sensing device configured to sense at least one power-related parameter of the power output cord. In some examples, the at least one power-related parameter corresponds to a current flowing through the power output cord.

In some examples, the at least one sensing device is a current sensor. In some examples, the PDU interface of the cord storage device includes at least one communication signal interface configured to report the at least one power-related parameter to the PDU. In some examples, the at least one communication signal interface includes an electrical signal interface, an optical signal interface, a radio frequency signal interface, or a combination thereof.

In some examples, the PDU interface of the cord storage device includes at least one power connector configured to provide electrical interconnection of the power output cord to at least one power line of the power input to the PDU.

In some examples, the cord storage device includes at least one relay having a first state to allow current to flow through the output cord to the output connector, and a second state to prevent current from flowing through the power output cord to the output connector. In some examples, the PDU interface of the cord storage device includes at least one control signal interface electrically interconnected to the at least one relay and configured to receive control signals from the PDU to control the state of the at least one relay. In some examples, the at least one control signal interface includes an electrical signal interface, an optical signal interface, a radio frequency signal interface, or a combination thereof.

In some aspects, a method for supplying power from a PDU to electronic equipment includes attaching a cord storage cartridge to the PDU, moving a portion of a power output cord through the at least one aperture to an extended state at least partially external to the cartridge housing, and connecting the power output cord to the electronic equipment. The cord storage cartridge may include a cartridge housing having at least one aperture and the power output cord stowed at least partially within the cartridge housing in a retracted state.

In some examples, attaching the cord storage cartridge to the PDU includes connecting the cord storage cartridge to a cartridge interface of the PDU and removably fastening the cord storage cartridge to the PDU with an attachment mechanism.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the spirit and scope of the appended claims. Features which are believed to be characteristic of the concepts disclosed herein, both as to their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present invention may be realized by reference to the following drawings. In the appended figures, similar components or features may have the same reference label.

DETAILED DESCRIPTION

Systems, methods and devices are provided that allow for efficient and flexible distribution of power to equipment located, for example, in an electrical equipment rack. Aspects of the present disclosure provide removable cord storage cartridges that can be connected to a PDU at various locations along the length of the PDU. Power output cords may be stowed within the cord storage cartridges, and the power output cords may have various types of output connectors. Such cord storage cartridges may allow a PDU to be configured with different numbers and types of power output cords, and may also allow variable lengths of power output cords connecting electronic equipment to the PDU, according to various embodiments.

This description provides examples, and is not intended to limit the scope, applicability or configuration of the invention. Rather, the ensuing description will provide those skilled in the art with an enabling description for implementing embodiments of the invention. Various changes may be made in the function and arrangement of elements.

Thus, various embodiments may omit, substitute, or add various procedures or components as appropriate. For instance, aspects and elements described with respect to certain embodiments may be combined in various other embodiments. It should also be appreciated that the following systems, devices, and components may individually or collectively be components of a larger system, wherein other procedures may take precedence over or otherwise modify their application.

The following patents and patent applications are incorporated herein by reference in their entirety: U.S. Pat. No. 7,043,543, entitled "Vertical-Mount Electrical Power Distribution Plugstrip," issued on May 9, 2006; U.S. Pat. No. 7,990,689, entitled "Power Distribution Unit And Methods Of Making And Use Including Modular Construction And Assemblies," issued on Aug. 2, 2011; U.S. Pat. No. 8,494,661, entitled "Power Distribution, Management, and Monitoring Systems," and issued on Jul. 23, 2013; U.S. Pat. No. 8,321,163, entitled "Monitoring Power-Related Parameters in a Power Distribution Unit," and issued on Nov. 27, 2012; U.S. Pat. No. 8,541,906, entitled "Polyphase Power Distribution and Monitoring Apparatus," and issued on Sep. 24, 2013; U.S. Pat. No. 8,305,737, entitled "Power Distribution Apparatus With Input and Output Power Sensing and Method of Use," and issued on Nov. 6, 2012; U.S. Pat. No. 8,587,950, entitled "Method and Apparatus for Multiple Input Power Distribution to Adjacent Outputs," and issued on Nov. 19, 2013; and U.S. application Ser. No. 14/959,207, entitled "Magneto-Resistive Sensor Device and Magnetic Bias Regulator Circuit, Along With Systems And Methods Incorporating Same," and filed on Dec. 4, 2015.

Figure 1:
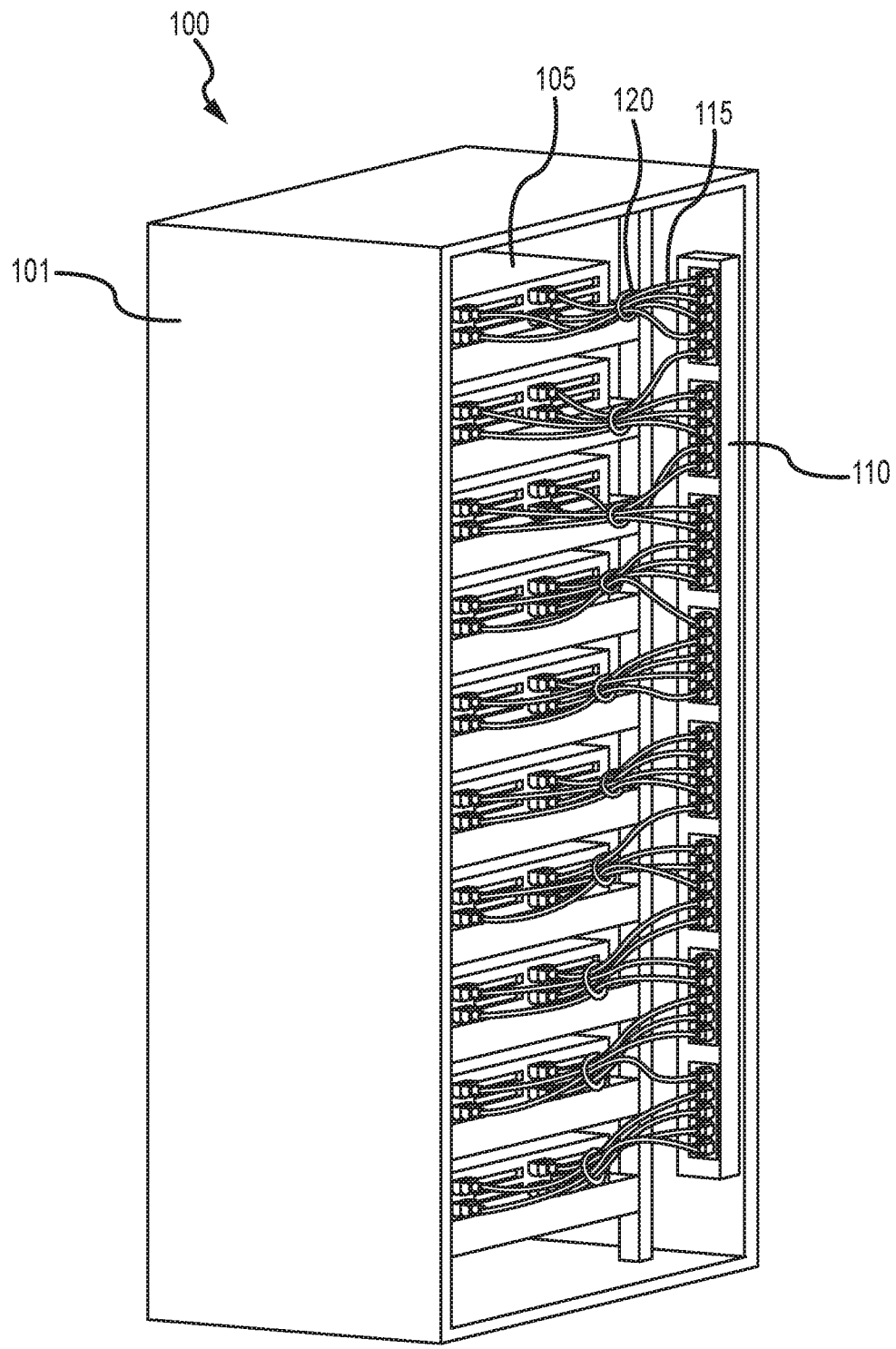
FIG. 1 is an illustration of an embodiment of a conventional equipment rack system.

FIG. 1 is an illustration of an embodiment of a conventional equipment rack system 100. The equipment rack system 100 includes an equipment cabinet 101 and electronic equipment 105 mounted in the equipment cabinet 101. The electronic equipment 105 may include various electronic devices, such as network switches, routers, servers and the like. A conventional PDU 110 is also mounted within the equipment cabinet 101. The conventional PDU 110 has a predetermined number of outlets of a certain type, which are spaced at predetermined intervals along the PDU 110. Separate power distribution cords 115 connect the outlets of the PDU 110 to the electronic equipment 105. Specific lengths of power distribution cords 115 may need to be used to keep the power distribution cords 115 organized and to maintain proper airflow around the equipment cabinet 101. Cable ties 120 may also be used to aid with the organization of the power distribution cords 115.

When changing or removing electronic equipment 105 from the equipment cabinet 101, the corresponding power distribution cords 115 need to be located and unplugged. Due to the bundling of the power distribution cords 115, locating and removing the necessary cords may be time-consuming and difficult. Furthermore, when adding electronic equipment 105 to the equipment cabinet 101, the conventional PDU 110 may not have available outlets near the location of the electronic equipment 105. In these cases, longer power distribution cords 115 may need to be used to connect the electronic equipment to the available outlets. These longer power distribution cords 115 may cause the electronic equipment 105 to be more difficult to access and may impact the airflow around the equipment cabinet 101. The conventional PDU 110 may also not have outlets of the correct type for connecting different electronic equipment 105. In these cases, an outlet adapter or a different PDU may be necessary in order to connect the electronic equipment 105.

Figure 2:
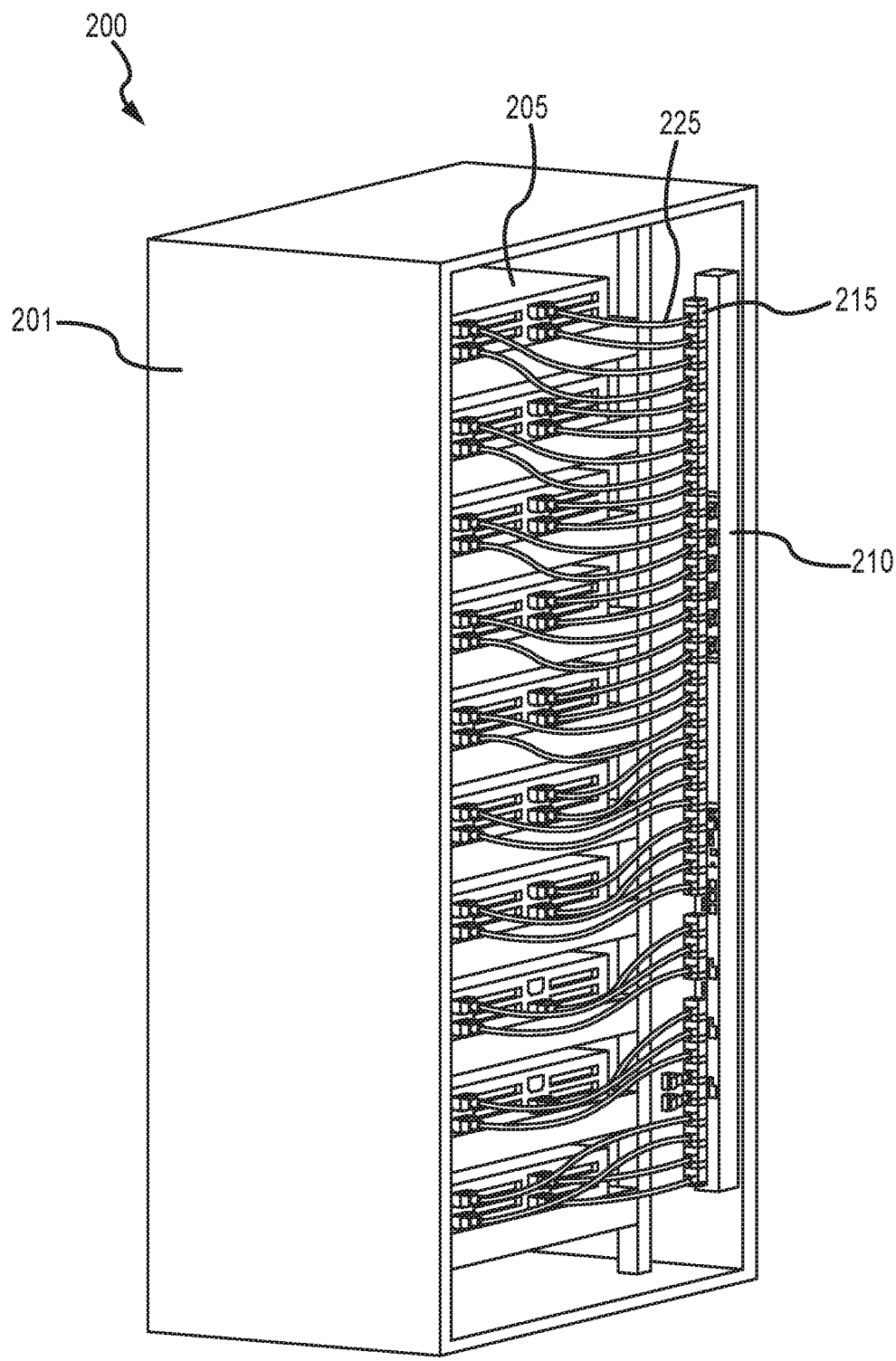
FIG. 2 is an illustration of an embodiment of an equipment rack system that includes a PDU having multiple removable cord storage cartridges, in accordance with various aspects of the present disclosure.

FIG. 2 is an illustration of an embodiment of an equipment rack system 200 that includes a PDU 210 having multiple removable cord storage cartridges 215, in accordance with various aspects of the present disclosure. The PDU 210 overcomes the problems of the conventional PDU 110 described in reference to FIG. 1, and also provides additional benefits, as further described herein. The equipment rack system 200 includes an equipment cabinet 201 and electronic equipment 205 mounted in the equipment cabinet 201. The electronic equipment 205 may include various electronic devices, such as network switches, routers, servers and the like. The PDU 210 having multiple removable cord storage cartridges 215 is also mounted within the equipment cabinet 201. Each cord storage cartridge 215 includes an associated power output cord 225 which may be used to connect the electronic equipment 205 to the PDU 210. A portion of each power output cord 225 may be stowed within its associated cord storage cartridge 215 such that only a length of each power output cord 225 necessary to connect the electronic equipment 205 to the PDU 210 is used. In this way, the power output cords 225 are more easily kept organized and air may flow more easily around the equipment cabinet 201.

If electronic equipment 205 is installed in the equipment cabinet 201 which requires a different type of power output cord 225, a cord storage cartridge 215 near the electronic equipment 205 may be removed and replaced with another cord storage cartridge 215 having the correct type of power output cord 225. Furthermore, the PDU 210 may be equipped with a number of cord storage cartridges 215 necessary for the amount of electronic equipment 205 in the equipment cabinet 201. If additional electronic equipment 205 is added to the equipment cabinet 201, then additional cord storage cartridges 215 may be added to the PDU 210. In this way, the PDU 210 may be configured with different numbers and types of power output cords 225, which allows more flexibility in the locations and types of electronic equipment 205 installed in the equipment cabinet 201.

Figure 3:
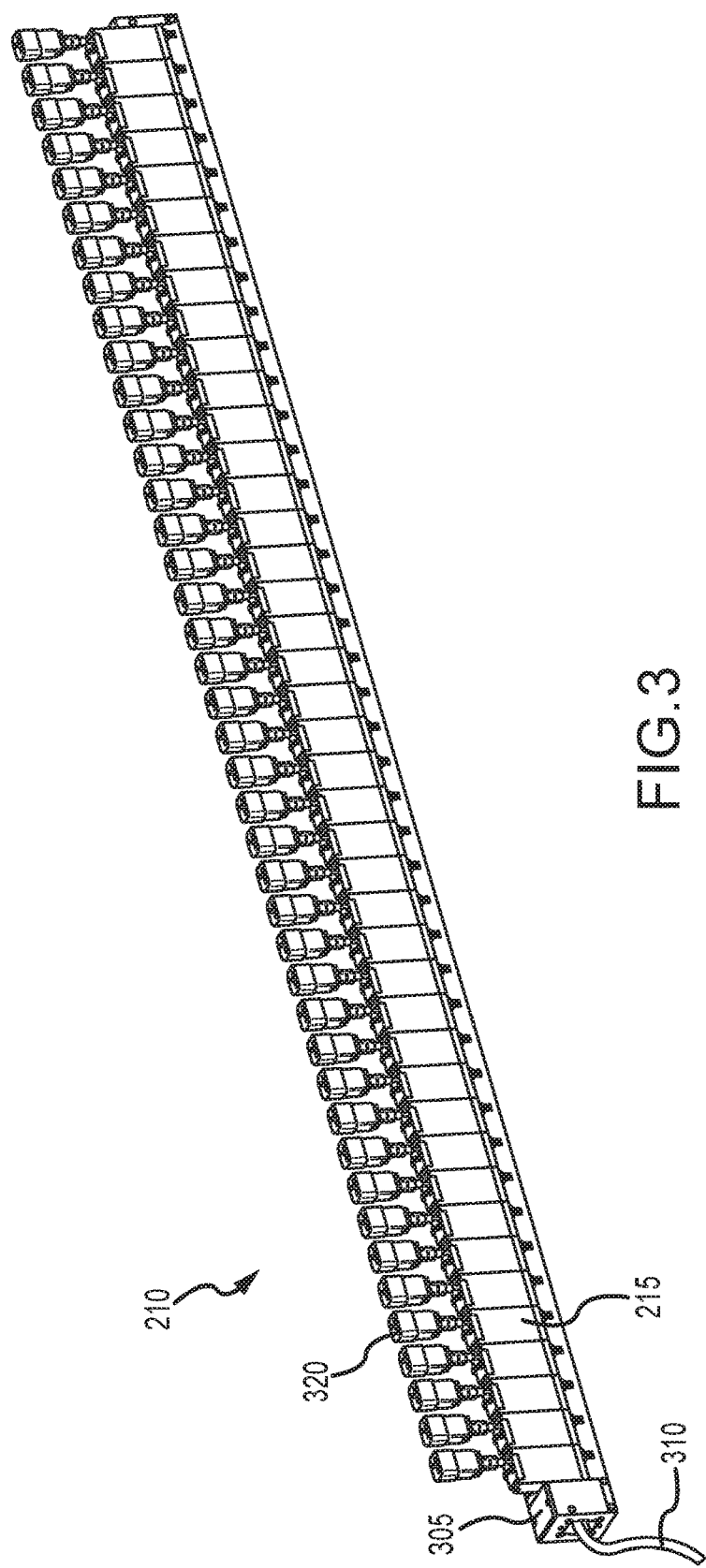
FIG. 3 is an illustration of an embodiment of a PDU filled with multiple removable cord storage cartridges, in accordance with various aspects of the present disclosure.

FIG. 3 is an illustration of an embodiment of a PDU 210 filled with multiple removable cord storage cartridges 215, in accordance with various aspects of the present disclosure. The PDU 210 includes a PDU housing 305 and a power input cord 310 that penetrates the PDU housing 305. The power input cord 310 may be connected to an external power source to provide power to the PDU 210. In some embodiments, the external power source may provide multiple phases of power, from a polyphase power source, to the PDU 210. The power input cord electrically interconnects one or more power line circuits (not shown) of the PDU 210 to the external power source. Each of the power line circuits may be associated with a phase of power provided by the external power source.

The PDU 210 according to this embodiment includes a PDU housing 305 that is vertically mountable in an equipment rack, although it will be understood that other form factors may be used, such as a horizontally mountable housing. The multiple removable cord storage cartridges 215 removably mate with the PDU 210, and more specifically the PDU housing 305, as further described herein.

Each of the cord storage cartridges 215 includes a power output cord stowed within the cord storage cartridge 215. Each of the power output cords includes an output connector 320 that is configured to connect to electronic equipment. Each of the power output cords may extend from their associated cord storage cartridges 215 to allow the output connectors 320 to connect to the electronic equipment, as further described herein. In the embodiment of FIG. 3, the output connectors 320 are illustrated as IEC-type connectors, although it will be readily understood that any of various other types of connectors alternatively can be used. For example, the output connectors 320 can be NEMA type connectors (e.g., NEMA 5-15R, NEMA 6-20R, NEMA 6-30R or NEMA 6-50R) or any of various IEC types (e.g., IEC C13 or IEC C19). In some embodiments, different cord storage cartridges 215 may have different types of output connectors 320.

Figure 4:
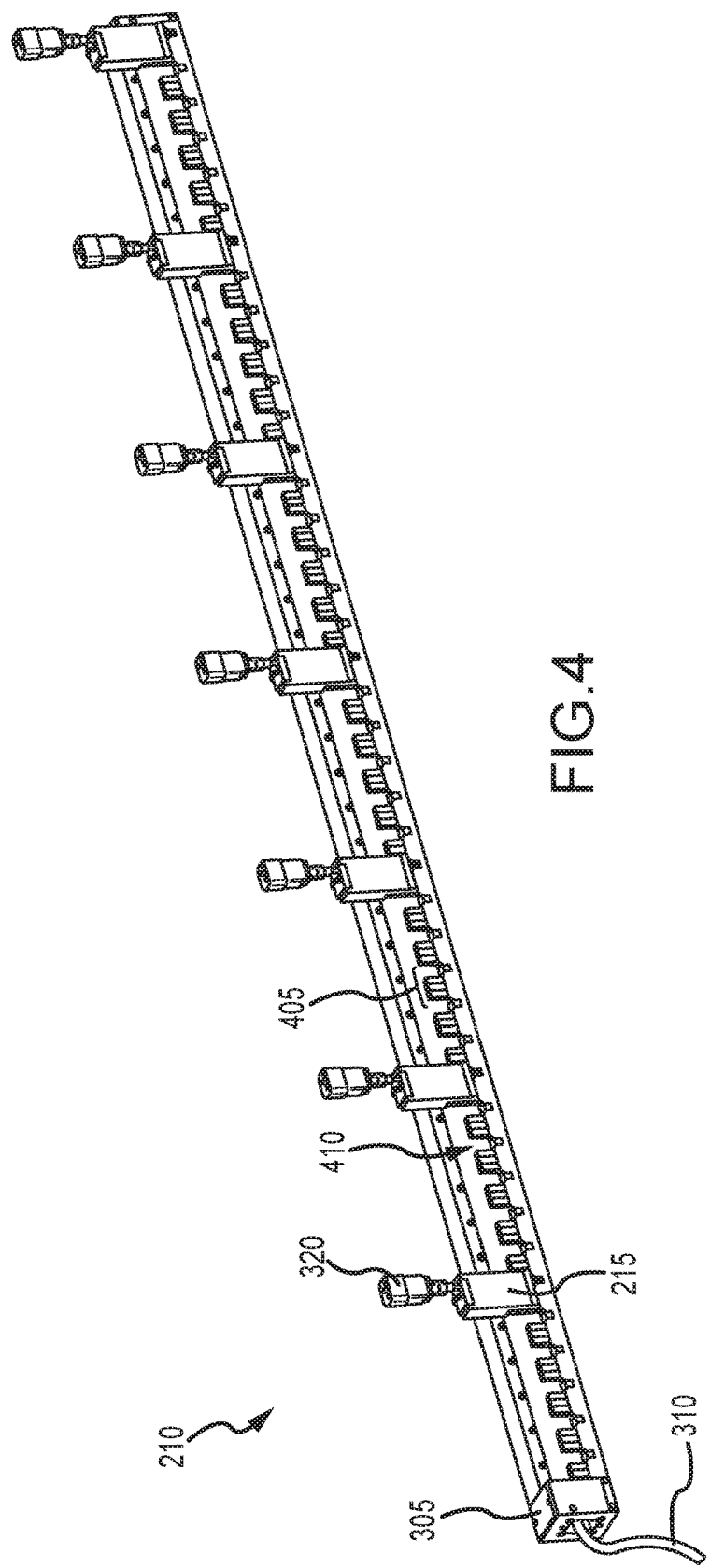
FIG. 4 is an illustration of an embodiment of the PDU partially filled with removable cord storage cartridges, in accordance with various aspects of the present disclosure.

FIG. 4 is an illustration of an embodiment of the PDU 210 partially filled with removable cord storage cartridges 215, in accordance with various aspects of the present disclosure. As shown in FIG. 4, the PDU 210 includes multiple cartridge interfaces 405. The multiple cartridge interfaces 405 are arranged within a channel 410 that runs longitudinally along a side of the PDU 210. Each of the cartridge interfaces 405 allow a cord storage cartridge 215 to mate with the PDU 210. The cord storage cartridges 215 may be interchangeable between the multiple cartridge interfaces 405. Various numbers of cord storage cartridges 215 may be connected to the PDU 210. For example, the number of cord storage cartridges 215 connected to the PDU 210 may correspond to an amount of electrical equipment receiving power from the PDU 210. In this way, the PDU 210 may be configured with only the number of cord storage cartridges 215 necessary for a particular application. As the application of the PDU 210 changes, cord storage cartridges 215 may be added or removed from the PDU 210. In some embodiments, empty cartridge interfaces 405 may be covered with a removable cover (not shown) to protect the empty cartridge interfaces 405.

Figure 5:
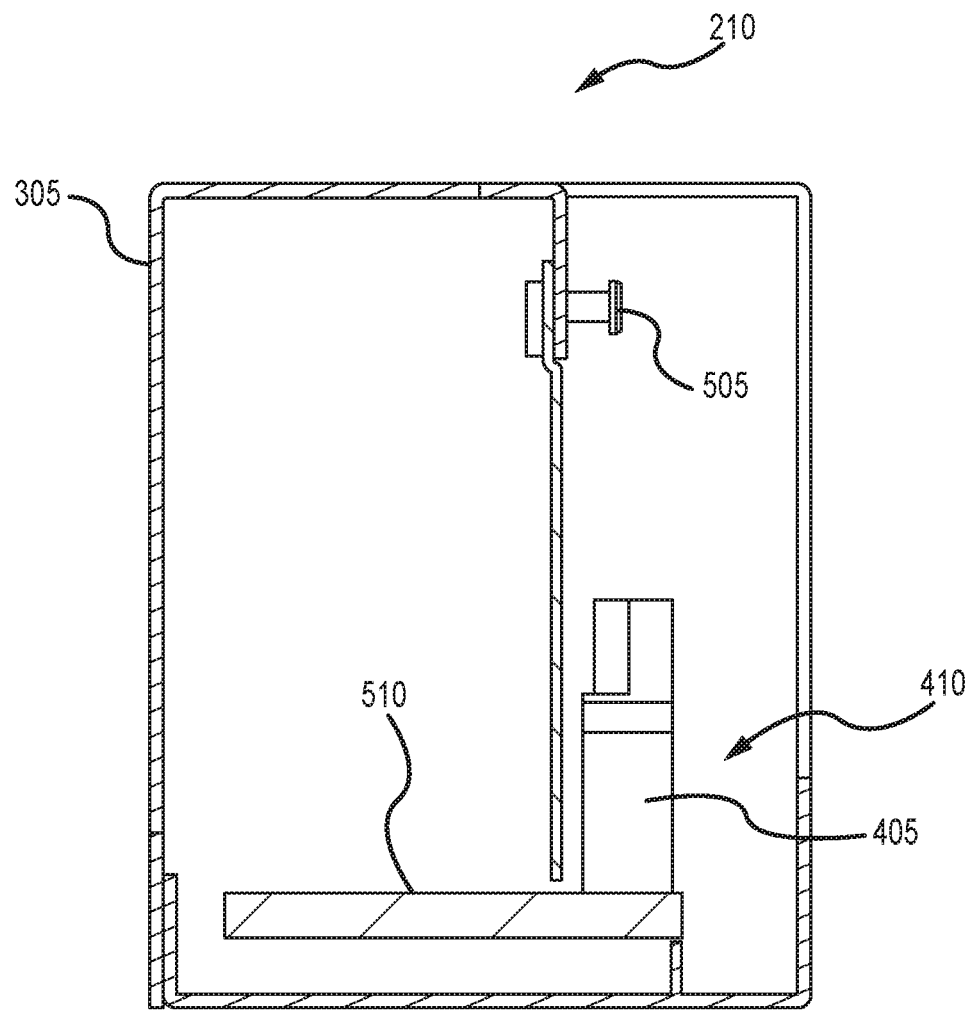
FIG. 5 is an end view in cross section of an embodiment of the PDU with cord storage cartridges removed, in accordance with various aspects of the present disclosure.

FIG. 5 is an end view in cross section of an embodiment of the PDU 210 with cord storage cartridges removed, in accordance with various aspects of the present disclosure. As shown in FIG. 5, the PDU housing 305 extends from the bottom of the PDU 210 to form the channel 410. The cartridge interfaces 405 may be mounted to a substrate 510 within the channel 410. In some embodiments, the substrate 510 extends from the channel 410 to the interior of the PDU housing 305. The substrate 510 may be a printed circuit board (PCB), and may include other electrical circuit components of the PDU 210. In some embodiments, the substrate 510 is a multi-layer PCB. Different layers of the multi-layer PCB may be associated with different phase power lines of the power input cord 310, as further described in U.S. Pat. No. 8,587,950, which is incorporated by reference herein in its entirety.

A cartridge attachment structure may be associated with each of the cartridge interfaces 405. Each cartridge attachment structure includes a post 505 extending from the PDU housing 305 above its associated cartridge interface 405. The posts 505 may aid in removably fastening each of the cord storage cartridges 215 to the PDU 210, as further described herein.

Figure 6:
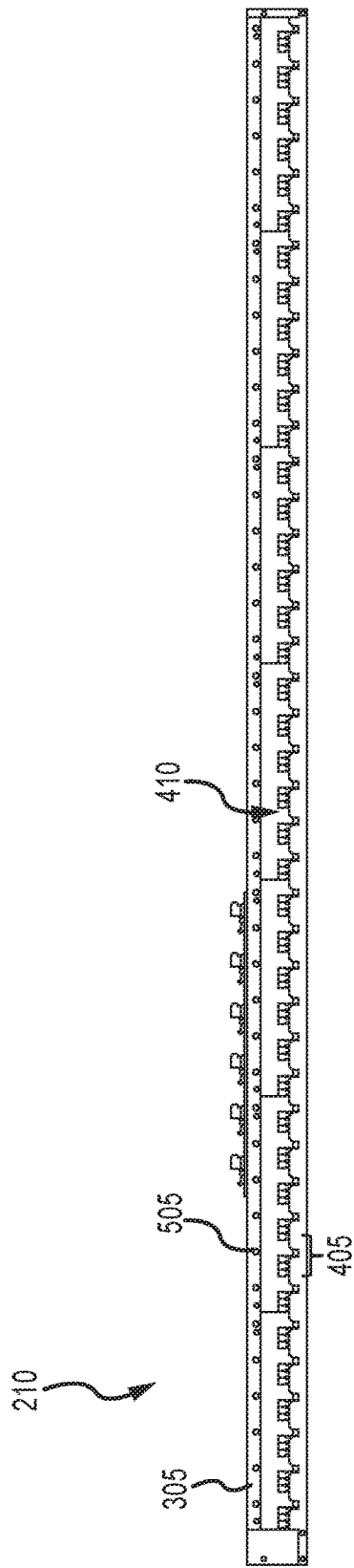
FIG. 6 is a side view in elevation of an embodiment of the PDU with cord storage cartridges removed, in accordance with various aspects of the present disclosure.

FIG. 6 is a side view in elevation of an embodiment of the PDU 210 with cord storage cartridges removed, in accordance with various aspects of the present disclosure. As shown in FIG. 6, each of the posts 505 extend from the PDU housing 305 above its associated cartridge interface 405.

Figure 7:
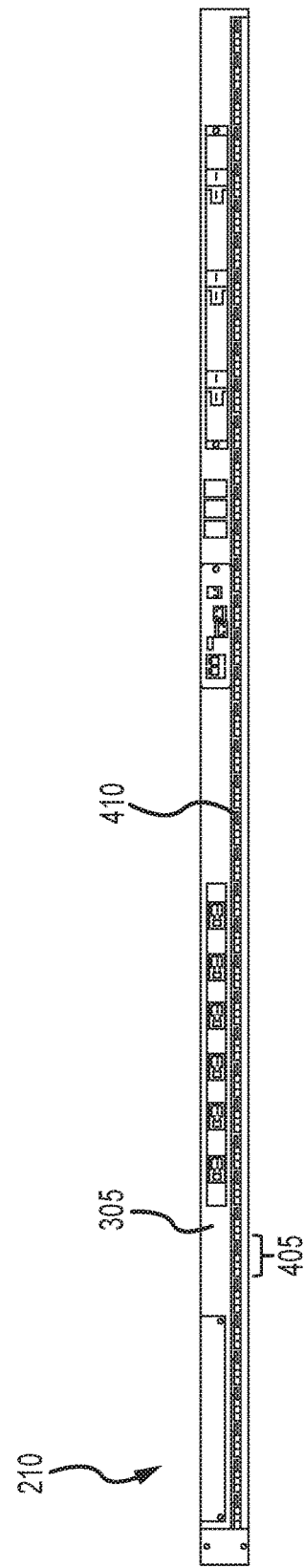
FIG. 7 is a front plan view of an embodiment of the PDU with cord storage cartridges removed, in accordance with various aspects of the present disclosure.

FIG. 7 is a front plan view of an embodiment of the PDU 210 with cord storage cartridges removed, in accordance with various aspects of the present disclosure. As shown in FIG. 6, the channel 410 containing the cartridge interfaces 405 extends along a substantial length of the PDU 210.

Figure 8:
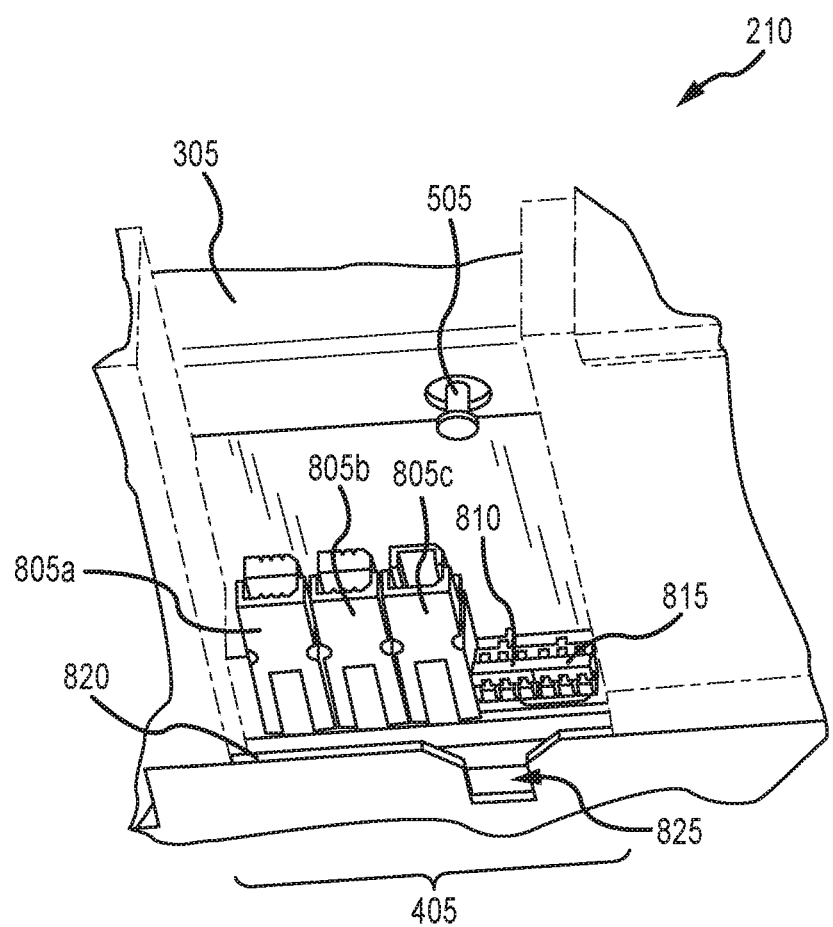
FIG. 8 is an enlarged partial perspective view of an embodiment of an empty cartridge interface of the PDU, in accordance with various aspects of the present disclosure.

FIG. 8 is an enlarged partial perspective view of an embodiment of an empty cartridge interface 405 of the PDU 210, in accordance with various aspects of the present disclosure. As shown in FIG. 8, the cartridge interface 405 includes an alignment notch 825 in a sidewall 820 of the channel 410 running along the length of the PDU 210. The sidewall 820 may also provide support for a cord storage cartridge 215 connected to the cartridge interface 405.

In some embodiments, the cartridge interface 405 includes three power connectors 805a-805c, which mate with corresponding power connectors of a cord storage cartridge 215. Each of the power connectors 805a-805c are in electrical communication with different power lines of the power input cord 310, as further described in reference to FIG. 21. For example, power connector 805a may be in electrical communication with a first phase power line of the power input cord 310, power connector 805b may be in electrical communication with a neutral power line of the power input cord 310, and power connector 805c may be in electrical communication with a ground line of the power input cord 310. As another example, power connector 805a may be in electrical communication with a first phase power line of the power input cord 310, power connector 805b may be in electrical communication with a second phase power line of the power input cord 310, and power connector 805c may be in electrical communication with a ground line of the power input cord 310. It will be understood that the power connectors 805a-805c may be in electrical communication with other power lines of the power input cord 310 and/or PDU 210. In addition, each of the cartridge interfaces 405 along the length of the PDU 210 may include power connectors in electrical communication with different power lines of the power input cord 310 and/or PDU 210. For example, adjacent cartridge interfaces 405 may include power connectors in electrical communication with different phase power lines of the power input cord 310. In this way, adjacent cord storage cartridges 215 may provide different phases of power to electrical equipment.

In some embodiments, the cartridge interface 405 also includes a communication signal interface 810, which communicates with a corresponding communication signal interface of a cord storage cartridge 215. The communication signal interface 810 may preferably be an electrical signal interface (e.g., an electrical connector). Alternative, in some embodiments, the communication signal interface 810 may be an optical signal interface (e.g., a fiber optic connector), a radio frequency signal interface (e.g., an antenna), or a combination of interfaces. The communication signal interface 810 may receive power-related parameters from a connected cord storage cartridge 215. For example, the communication signal interface 810 may receive power-related parameters associated with the current flowing through the power output cord of the connected cord storage cartridge 215. In some embodiments, the power-related parameter may be a waveform corresponding to the current flowing through the power output cord. In other embodiments, the power-related parameter may be a value corresponding to the current flowing through the power output cord. The communication signal interface 810 may also be in communication with a communications bus of the PDU 210. The communications bus may in turn be in communication with a communications module of the PDU 210, which may allow the PDU to report the power-related parameters, or other parameters derived from the power-related parameters, to a network.

In some embodiments, the cartridge interface 405 also includes a control signal interface 815, which communicates with a corresponding control signal interface of a cord storage cartridge 215. The control signal interface 815 may preferably be an electrical signal interface (e.g., an electrical connector). Alternative, in some embodiments, the control signal interface 815 may be an optical signal interface (e.g., a fiber optic connector), a radio frequency signal interface (e.g., an antenna), or a combination of interfaces. The control signal interface 815 may provide control signals to a connected cord storage cartridge 215. Alternatively, in some embodiments, the control signals may be provided via the communication signal interface 810.

The control signals control the operation of the connected cord storage cartridge 215. For example, the control signals may control the operation of a relay within the cord storage cartridge 215. The control signals may switch the relay between a first state which allows current to flow through the power output cord of the cord storage cartridge 215, and a second state which prevents current from flowing through the power output cord. The control signal interface 815 may be in communication with a processor of the PDU 210. The processor may provide the control signals to the control signal interface 815.

The power connectors 805a-805c, communication signal interface 810, and control signal interface 815 may be mounted to the substrate 510 within the channel 410, as shown in FIG. 5. While shown with three power connectors 805a-805c, one communication signal interface 810, and one control signal interface 815, the number and types of connectors of each cartridge interface 405 may vary.

Figure 9:
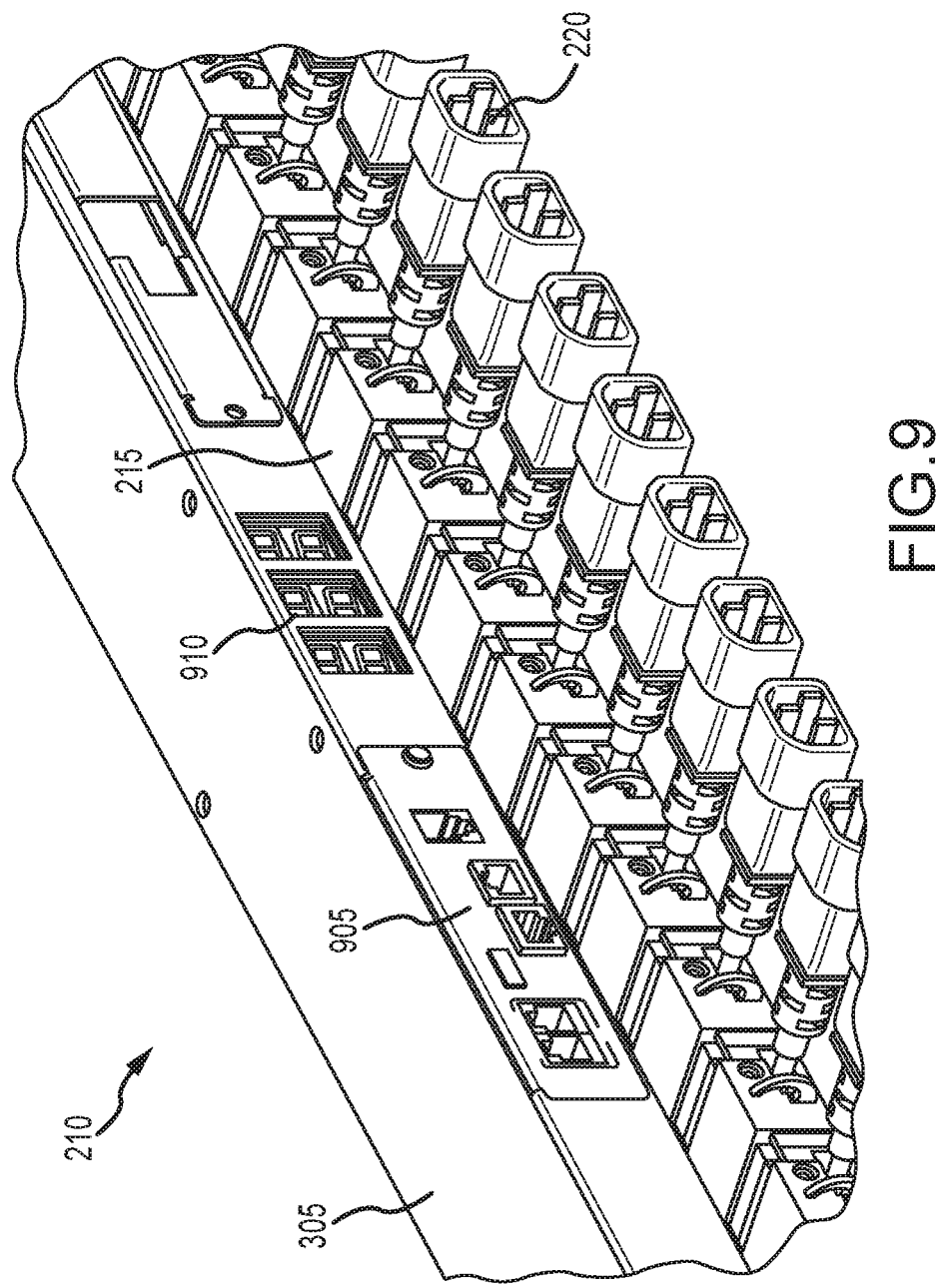
FIG. 9 is a partial perspective view of an embodiment of the PDU showing various features of the PDU, in accordance with various aspects of the present disclosure.

FIG. 9 is a partial perspective view of an embodiment of the PDU 210 showing various features of the PDU 210, in accordance with various aspects of the present disclosure. The PDU 210 includes a communications module 905 that may be coupleable with one or more of a local computer, local computer network, and/or remote computer network. The communications module 905 may be used to report information related to current operating parameters of the PDU 210 to one or more of the local computer, local computer network, and/or remote computer network. The communications module 905 may also receive information or instructions related to the operation of the PDU 210 from one or more of the local computer, local computer network, and/or remote computer network. The communications module 905 may be in communication with a communications bus of the PDU 210, and may receive information from the each of the cord storage cartridges 215 through their associated communication signal interfaces 810, as shown in FIG. 8.

A display portion 910 may be used to provide a local display of information related to the current operating parameters of the PDU 210, such as power-related parameters of the power input cord and/or one or more of the power output cords. In one embodiment, the power-related parameter is the quantity of current (e.g., amperes) being provided through the power input cord and/or one or more of the power output cords. The power-related parameter may also include a quantity of voltage (e.g., volts) being provided through the power input cord and/or one or more of the power output cords, a frequency of power (e.g., Hertz) being provided through the power input cord and/or one or more of the power output cords, a quantity of power (e.g., Watts) being provided through the power input cord and/or one or more of the power output cords, a quantity of power over a period of time (e.g., kilowatt hours) being provided through the power input cord and/or one or more of the power output cords, and/or other power-related parameters. The display portion 910 may display one or more of the power-related parameters using various display technology, such as segment displays, light-emitting diode displays, and/or liquid crystal displays.

Figure 10:
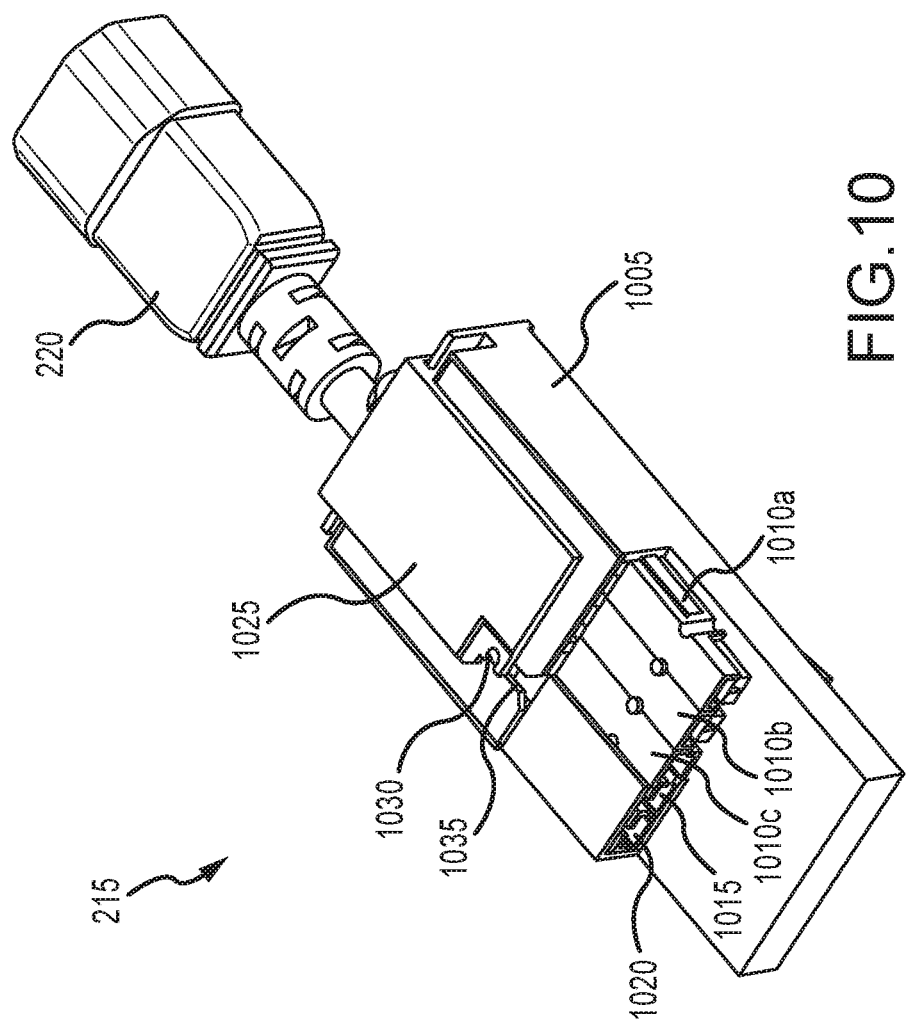
FIG. 10 is a perspective view of an embodiment of a cord storage cartridge, in accordance with various aspects of the present disclosure.

FIG. 10 is a perspective view of an embodiment of a cord storage cartridge 215, in accordance with various aspects of the present disclosure. The cord storage cartridge 215 includes a cartridge housing 1005. An attachment mechanism 1025 is moveably coupled to the cartridge housing 1005, and retains the cord storage cartridge 215 to a cartridge attachment structure of the PDU 210 when in a secured position. The attachment mechanism 1025 includes a notch 1030 which receives a post 505 associated with a particular cartridge interface 405 of the PDU 210, as shown in FIG. 8. The cartridge housing 1005 may include a guide slot 1035 to guide the post 505 into a position where it can be received by the notch 1030. The attachment mechanism 1025 may slide relative to the cartridge housing 1005 between a secured position and an unsecured position. In the secured position, the post 505 is retained by the notch 1030, which retains the cord storage cartridge 215 to the PDU 210. In the unsecured position, the post 505 may move freely into and out of the guide slot 1035, which may allow the cord storage cartridge 215 to be connected or disconnected from the PDU 210.

The cord storage cartridge 215 may include three power connectors 1010a-1010c, which mate with corresponding power connectors 805a-805c of a PDU 210, as shown in FIG. 8. The power output cord of the cord storage cartridge 215 is in electrical communication with the power connectors 1010a-1010c. In this way, the power output cord may receive power from the PDU 210 when the cord storage cartridge 215 is connected to the cartridge interface 405 of the PDU 210.

In some embodiments, the cord storage cartridge 215 also includes a communication signal interface 1015, which communicates with a corresponding communication signal interface 810 of a PDU 210, as shown in FIG. 8. The communication signal interface 1015 may preferably be an electrical signal interface (e.g., an electrical connector). Alternative, in some embodiments, the communication signal interface 1015 may be an optical signal interface (e.g., a fiber optic connector), a radio frequency signal interface (e.g., an antenna), or a combination of interfaces. The communication signal interface 1015 may report power-related parameters to the PDU 210. For example, the communication signal interface 1015 may report power-related parameters from a sensing device within the cord storage cartridge 215, as further described herein. In some embodiments, the sensing device may be a current sensor, which may sense current flowing through the power output cord.

In some embodiments, the cord storage cartridge 215 also includes a control signal interface 1020, which communicates with a corresponding control signal interface 815 of a PDU 210, as shown in FIG. 8. The control signal interface 1020 may preferably be an electrical signal interface (e.g., an electrical connector). Alternative, in some embodiments, the control signal interface 1020 may be an optical signal interface (e.g., a fiber optic connector), a radio frequency signal interface (e.g., an antenna), or a combination of interfaces. The control signal interface 1020 may receive control signals from the PDU 210. Alternatively, in some embodiments, the control signals may be received via the communication signal interface 1015.

The control signals control the operation of the cord storage cartridge 215. For example, the control signals may control the operation of a relay within the cord storage cartridge 215. The control signals may switch the relay between a first state which allows current to flow through the power output cord, and a second state which prevents current from flowing through the power output cord.

As shown in FIG. 10, the communication signal interface 1015 and control signal interface 1020 may be at least partially covered by the cartridge housing 1005. While shown with three power connectors 1010a-1010c, one communication signal interface 1015, and one control signal interface 1020, the number and types of connectors of the cord storage cartridge 215 may vary.

Figure 11:
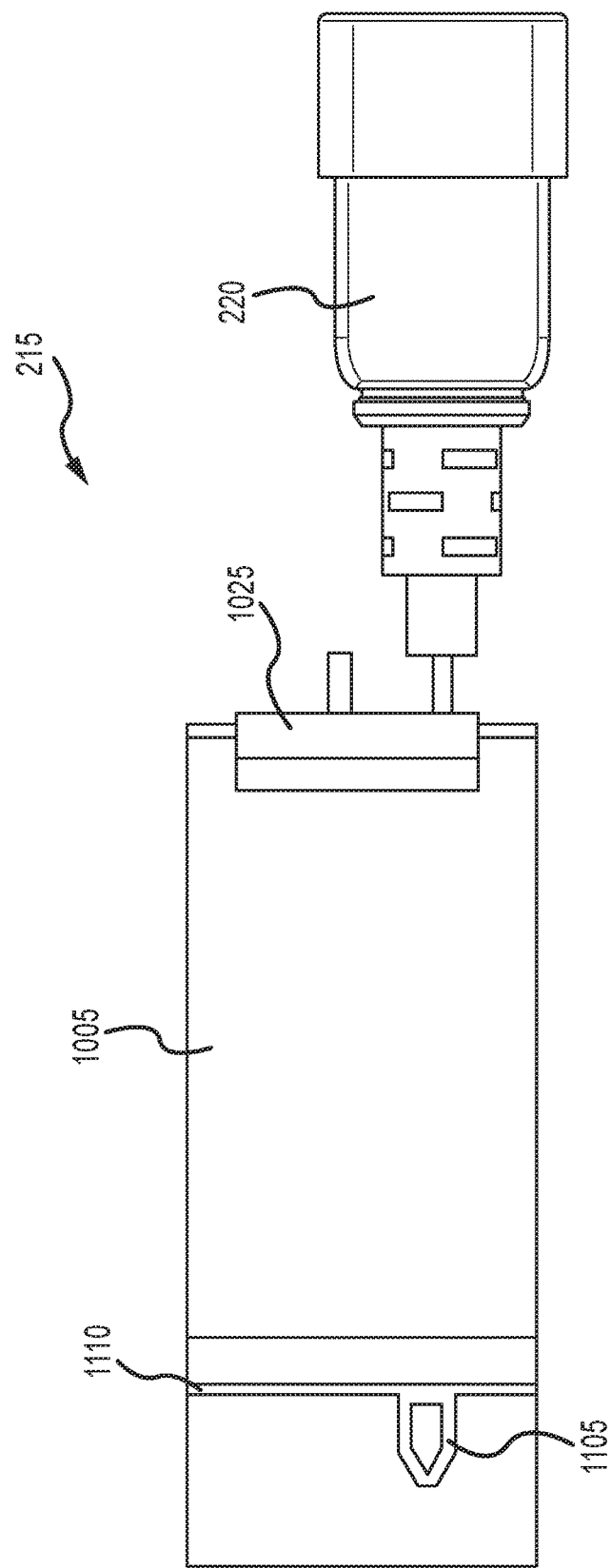
FIG. 11 is a side view of an embodiment of a cord storage cartridge, in accordance with various aspects of the present disclosure.

FIG. 11 is a side view of an embodiment of a cord storage cartridge 215, in accordance with various aspects of the present disclosure. As shown in FIG. 11, the front of the cartridge housing 1005 includes an alignment tab 1105 which may guide the cord storage cartridge 215 into position to mate with a cartridge interface 405 of a PDU 210. The alignment tab 1105 may be guided by an alignment notch 825 in a sidewall 820 of the PDU housing 305, as shown in FIG. 8. The front of the cartridge housing 1005 may also include a shelf 1110 which may engage the top of the sidewall 820 of the PDU housing 305, as shown in FIG. 8.

Figure 12:
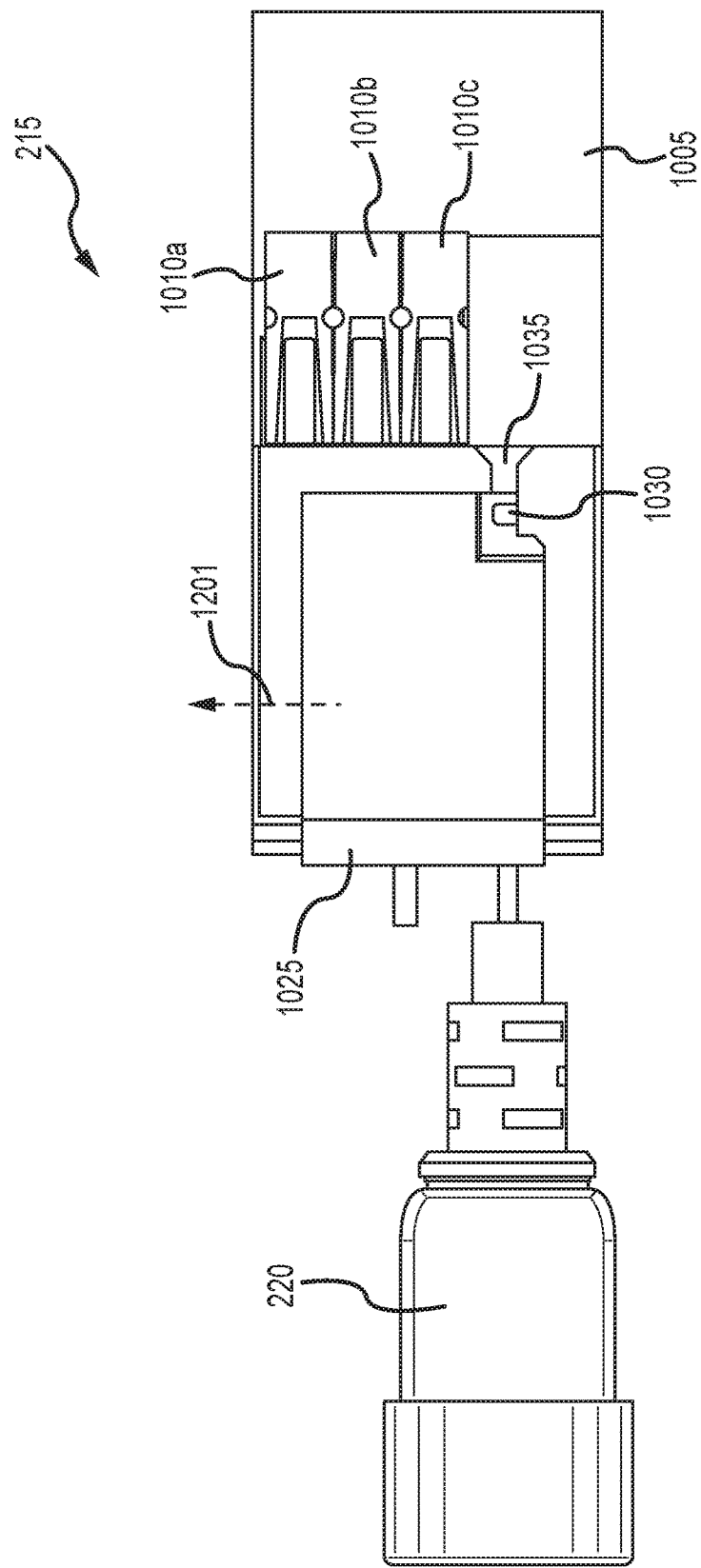
FIG. 12 is an opposing side view of an embodiment of a cord storage cartridge, in accordance with various aspects of the present disclosure.

FIG. 12 is an opposing side view of an embodiment of a cord storage cartridge 215, in accordance with various aspects of the present disclosure. As shown in FIG. 12, the attachment mechanism 1025 is in a secured position. When in the secured position, the notch 1030 prevents the post 505 of the PDU 210 (as shown in FIG. 8) from moving into or out of the guide slot 1035. The attachment mechanism 1025 may move toward an unsecured position as indicated by line 1201. In the unsecured position, the notch 1030 does not overlap the guide slot 1035, which allows the post 505 to move freely into or out of the guide slot 1035.

Figure 13:
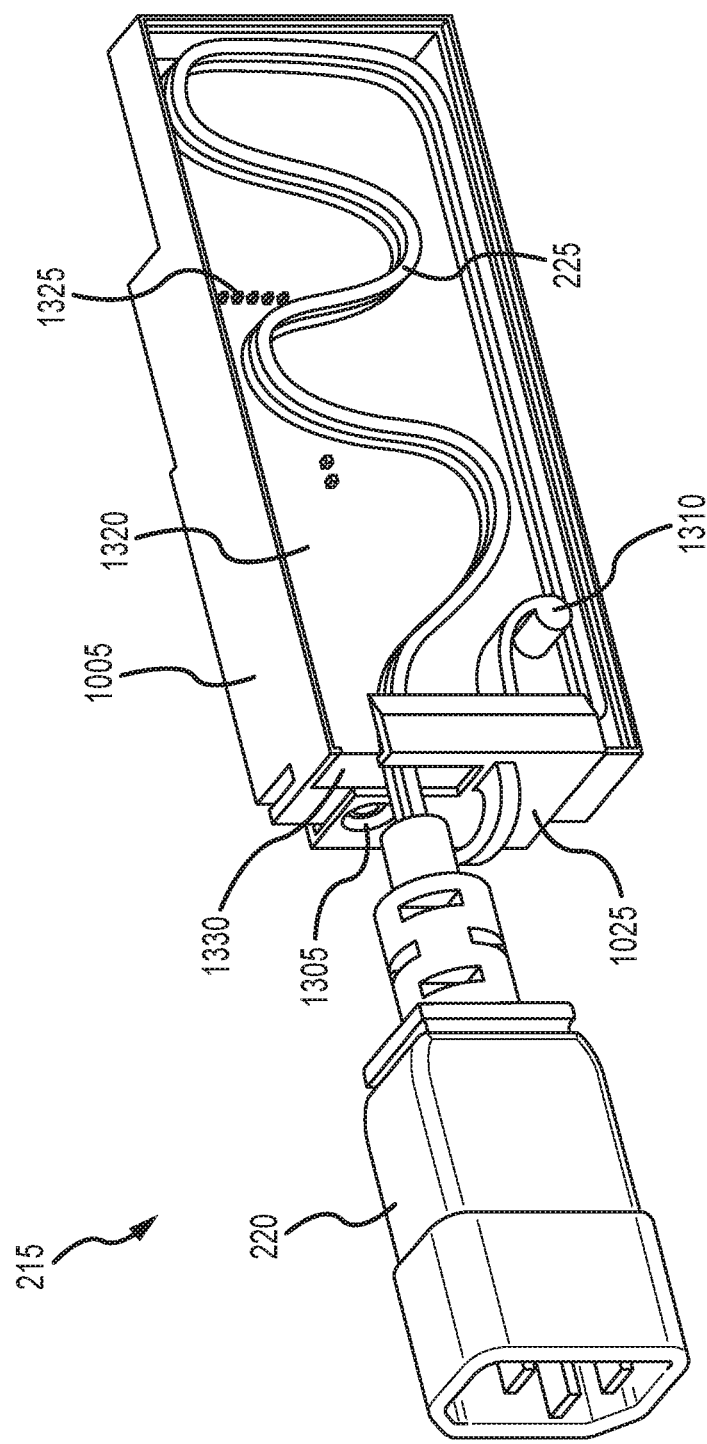
FIG. 13 is a perspective view of an embodiment of a cord storage cartridge with a side of the cartridge housing removed, in accordance with various aspects of the present disclosure.

FIG. 13 is a perspective view of an embodiment of a cord storage cartridge 215 with the front of the cartridge housing 1005 removed, in accordance with various aspects of the present disclosure. As shown in FIG. 13, the cartridge housing 1005 includes a cavity within which a power output cord 225 may be stowed in a retracted state. The cavity is formed by the cartridge housing 1005 and a cartridge substrate 1320. In some embodiments, the power output cord 225 is stowed within the cavity in a folded or serpentine orientation. Alternatively, the power output cord 225 may be stowed in a coiled orientation, or other orientations. In some embodiments, the power output cord 225 may be a flat cord, also referred to as a ribbon cable, which may allow the power output cord 225 to be more efficiently stowed within the cavity. The power output cord 225 may be held in the cavity through a combination of cord 'memory' and friction between the power output cord 225 and the internal walls of the cartridge housing 1005.

A portion of the power output cord 225 may be moved out of the cavity through an aperture 1330 and into an extended state. The extended state may allow the power output cord 225 to extend from a PDU 210 to electrical equipment in an equipment cabinet, as shown in FIG. 2. The output connector 220 may then connect the electrical equipment to the PDU 210, which may allow the electrical equipment to receive power from the PDU 210. A relief arm 1310 may prevent a portion of the power output cord 225 from extending out of the cord storage cartridge 215. The relief arm 1310 may also prevent the power output cord 225 from bending at sharp angles within the cartridge housing 1005 when in the extended state.

When in the extended state, the extended portion of the power output cord 225 may be moved back through the aperture 1330, into the retracted state, and stowed within the cartridge housing 1005 as shown in FIG. 13. In some embodiments, the power output cord 225 may be preconditioned to return to the serpentine orientation when moved back to the retracted state based on the cord 'memory'. The relief arm 1310 may aid in guiding the power output cord to the serpentine orientation.

The cartridge substrate 1320 provides a support surface onto which internal components of the cord storage cartridge 215 may be mounted. In some embodiments, the communication signal interface 1015 and control signal interface 1020 (shown in FIG. 10) are mounted to the opposite side of the cartridge substrate 1320. Mounting pins 1325 may extend through the cartridge substrate 1320 to secure the communication signal interface 1015 and control signal interface 1020 to the cartridge substrate 1320.

Figure 14:
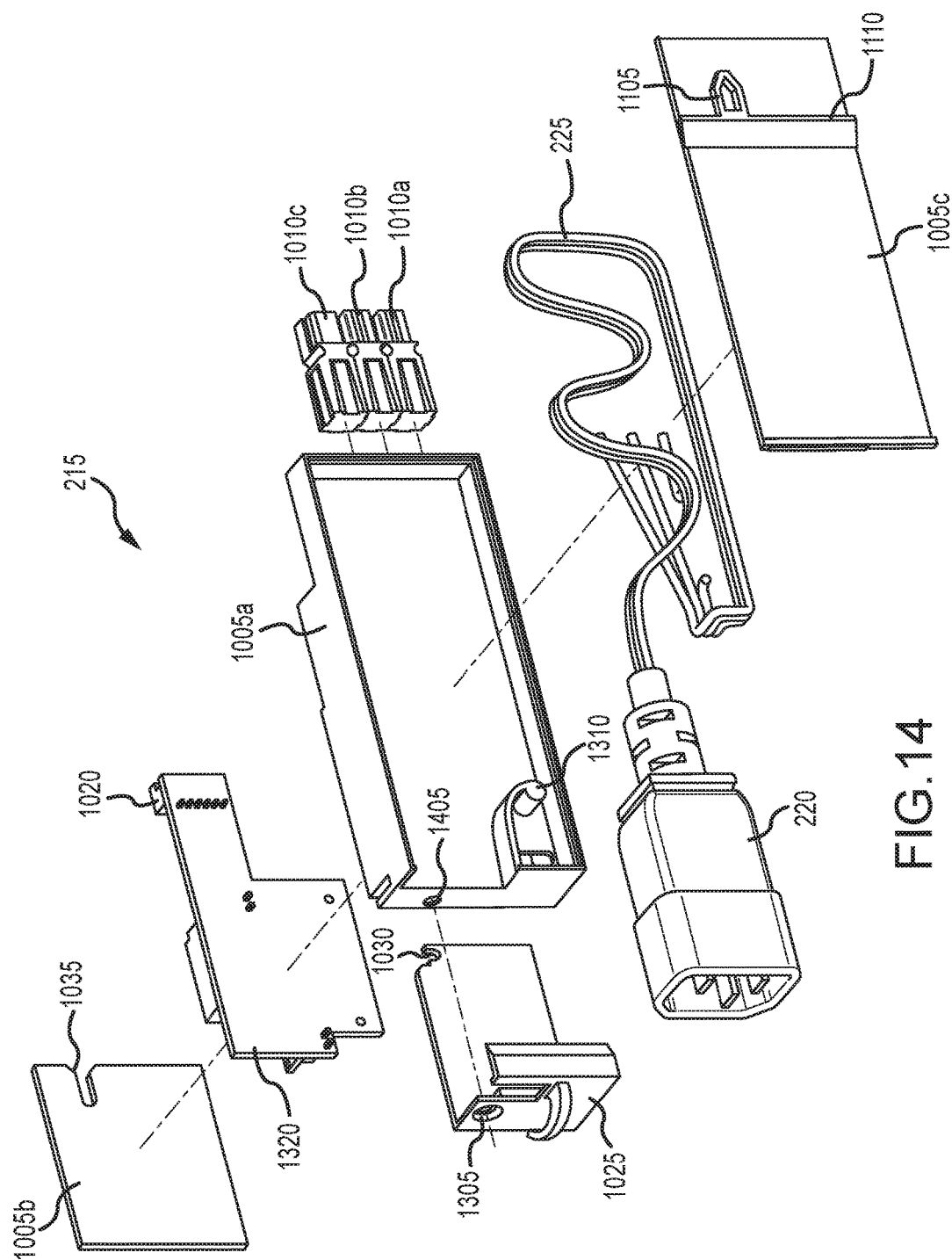
FIG. 14 is an exploded perspective view of an embodiment of a cord storage cartridge, in accordance with various aspects of the present disclosure.

As shown in FIG. 13, the attachment mechanism 1025 may include a locking mechanism. The locking mechanism is a hole 1305 extending through the attachment mechanism 1025. When in the secured position, the hole 1305 overlaps a corresponding locking hole in the cartridge housing 1005 (as shown in FIG. 14). A screw or other locking device may inserted through the hole 1305 and into the cartridge housing 1005. With the screw or other locking device inserted, the attachment mechanism 1025 may be prevented from moving from the secured position to the unsecured position. In this way, the cord storage cartridge 215 may be locked to a PDU 210.

FIG. 14 is an exploded perspective view of an embodiment of a cord storage cartridge 215, in accordance with various aspects of the present disclosure. The cartridge housing 1005 includes a main body 1005a, a rear face 1005b, and a front face 1005c. The main body 1005a, rear face 1005b, and front face 1005c may be coupled to each other using sonic welding, adhesives, or other attachment techniques. The front face 1005c of the cartridge housing 1005 includes the alignment tab 1105 and shelf 1110 which may aid with mating the cord storage cartridge 215 with a PDU 210, as described in reference to FIG. 11. The rear face 1005b of the cartridge housing 1005 includes the guide slot 1035 to guide a post 505 of the PDU 210, as described in reference to FIG. 10. The guide slot 1035 guides the post 505 into a position where it can be received by the notch 1030 in the attachment mechanism 1025.

As shown in FIG. 14, the power output cord 225 may extend around the cartridge substrate 1320 to connect to the power connectors 1010a-1010c. One or more lines of the power output cord 225 may be electrically interconnected to the cartridge substrate 1320. This may allow for measurement of power-related parameters of the power output cord 225 and/or control of the power output of the power output cord 225. For example, the power output cord 225 may be electrically interconnected to the substrate 1320 to allow measurement of the current flowing through the power output cord 225. The power output cord 225 may also be electrically interconnected to a relay mounted to the substrate 1320 to allow control of the flow of power through the power output cord 225.

The cartridge housing 1005 includes a locking hole 1405 that aligns with the hole 1305 in the attachment mechanism 1025 when the attachment mechanism 1025 is in the secured position, as described in reference to FIG. 13. The hole 1405 and/or locking hole 1305 may be threaded to help secure a screw inserted through the attachment mechanism 1025.

Figure 15:
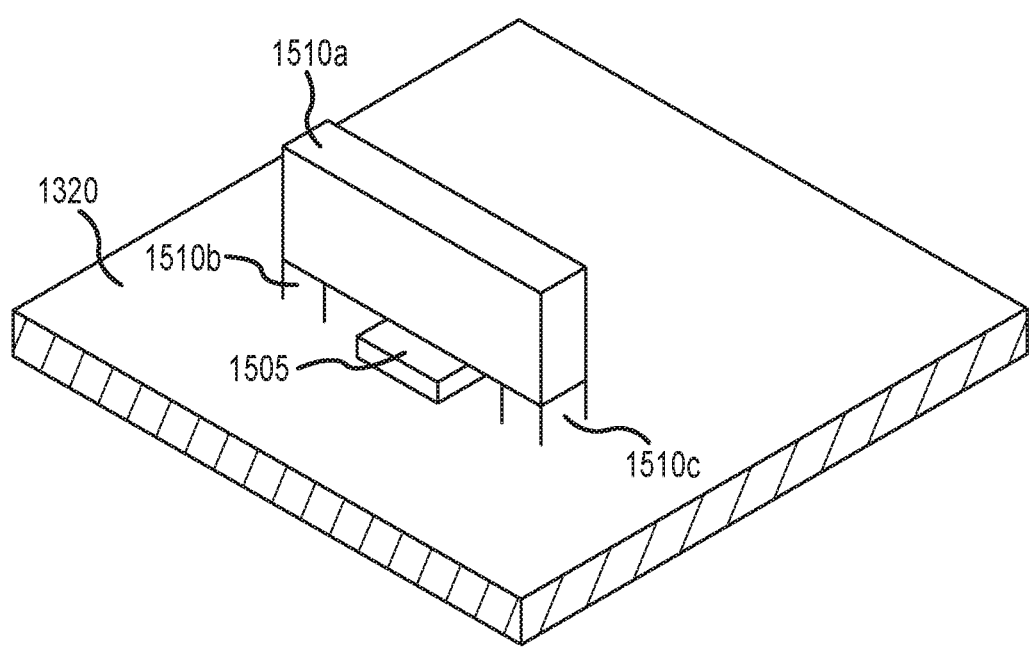
FIG. 15 is a perspective view of a substrate portion contained within an embodiment of the cord storage cartridge, in accordance with various aspects of the present disclosure.

FIG. 15 is a perspective view of a portion of an embodiment of the cartridge substrate 1320, in accordance with various aspects of the present disclosure. In some embodiments, a current sensing device 1505 is mounted to the cartridge substrate 1320. The current sensing device 1505 may be, for example, a magnetic tunnel junction device that senses variations in a magnetic field caused by current flowing through the power output cord of the cartridge.

In some embodiments, ferrite shielding 1510a-c is mounted in close proximity to the current sensing device 1505. The ferrite shielding 1510a-c may mitigate the effects of external magnetic fields on the current sensing device 1505. The external magnetic fields may be caused by nearby cord storage cartridges, or other nearby electronic or magnetic devices. The ferrite shielding 1510a-c may allow the current sensing device 1505 to more accurately sense the current flowing through its corresponding power output cord by reducing the interference caused by the external magnetic fields.

The ferrite shielding 1510a-c may be mounted to the cartridge substrate 1320 on two sides of the current sensing device 1505. The ferrite shielding 1510a-c may extend around the current sensing device 1505 as shown in FIG. 15 to substantially encircle the current sensing device 1505. In some embodiments, the ferrite shielding 1510a-c includes multiple pieces of ferrite bonded to each other. Alternatively, in some embodiments, the ferrite shielding may be formed from a single piece of ferrite.

Figure 16:
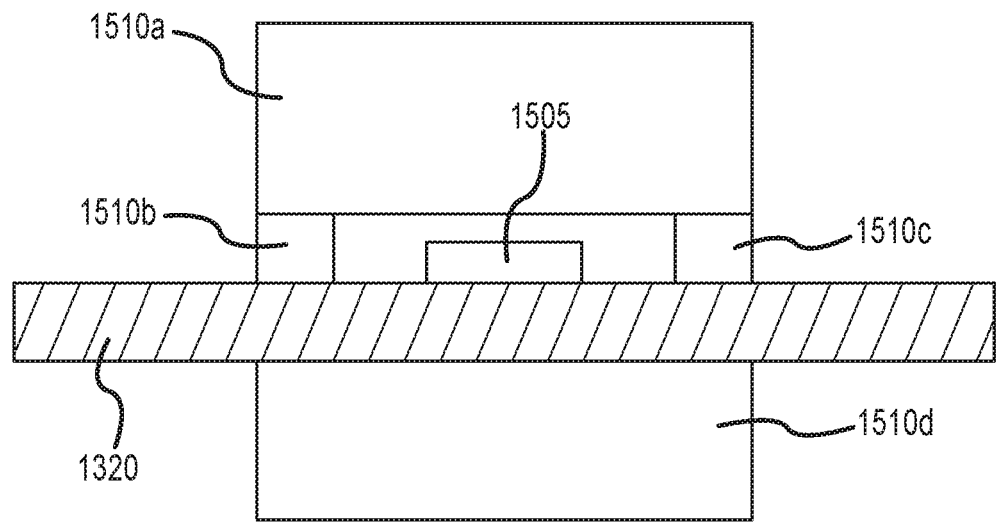
FIGS. 16-17 are side views of an embodiment of ferrite shielding encircling a current sensing device, in accordance with various aspects of the present disclosure.
Figure 17:
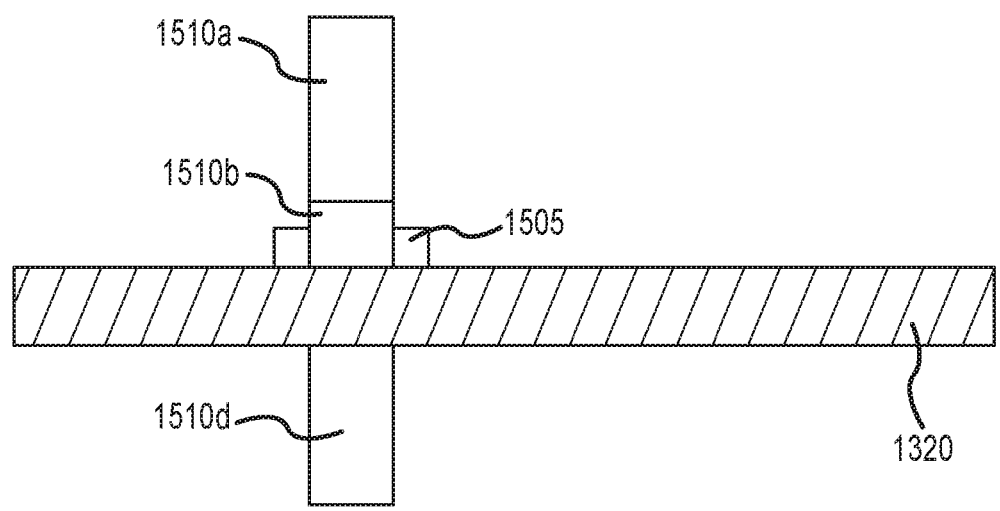

FIGS. 16-17 are side views of an embodiment of ferrite shielding 1510a-d encircling a current sensing device 1505, in accordance with various aspects of the present disclosure. As shown in FIGS. 16-17, the ferrite shielding 1510a-d includes a ferrite shielding portion 1510d extending below the cartridge substrate 1320. In some embodiments, ferrite shielding portions 1510b and 1510c may extend through the cartridge substrate 1320 and may be bonded to the ferrite shielding portion 1510d. In other embodiments, the ferrite shielding portions 1510b and 1510c may be mounted to the upper surface of the cartridge substrate 1320, and the ferrite shielding portion 1510d may be mounted to the lower surface of the cartridge substrate 1320. Alternatively, in some embodiments, the ferrite shielding may be formed from a single piece of ferrite.

Figure 18:
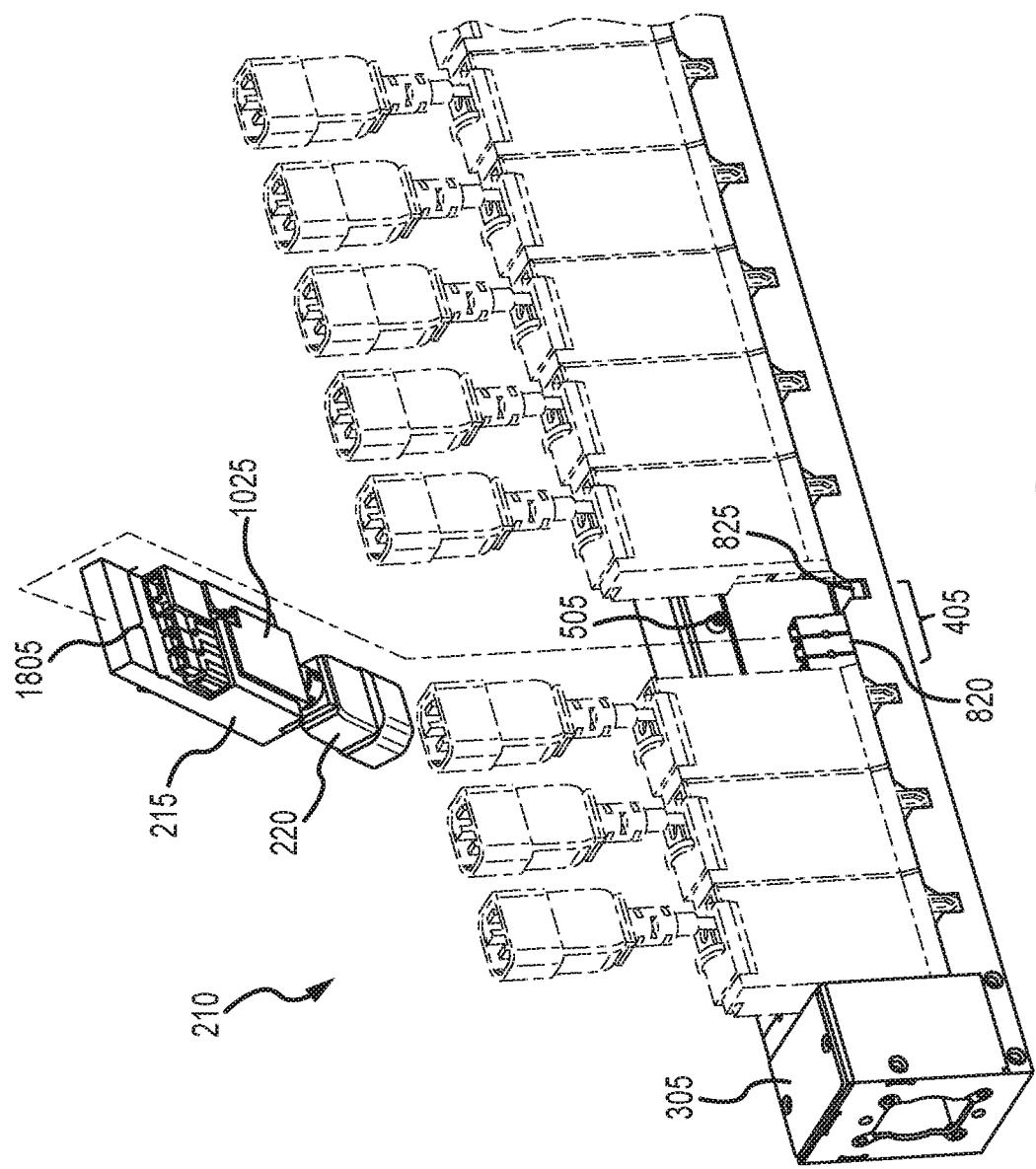
FIG. 18 is an illustration of an embodiment of the PDU with a representative cord storage cartridge removed from the PDU, in accordance with various aspects of the present disclosure.

FIG. 18 is an illustration of an embodiment of the PDU 210 with a representative cord storage cartridge 215 removed from the PDU 210, in accordance with various aspects of the present disclosure. As shown in FIG. 18, the cord storage cartridge 215 includes a PDU interface 1805 that mates with a cartridge interface 405 of the PDU 210. The PDU interface 1805 includes the power connectors 1010a-1010c, communication signal interface 1015, and control signal interface 1020 described in reference to FIG. 10. The cord storage cartridge 215 may be guided to the cartridge interface 405 by the alignment notch 825 in the sidewall 820, as described in reference to FIG. 8. The sidewall 820 may also provide support for the cord storage cartridge 215.

The attachment mechanism 1025 retainably fastens the cord storage cartridge 215 to the PDU housing 305 when the cord storage cartridge 215 is connected to the PDU 210. The attachment mechanism 1025 receives a post 505 associated with the cartridge interface 405, as described in reference to FIGS. 5 and 10. The attachment mechanism 1025 may be moved between a secured position and an unsecured position. The cord storage cartridge 215 may be removed from the PDU 210 by moving the attachment mechanism 1025 from the secured position to the unsecured position, which unfastens the cord storage cartridge 215 from the notch 505.

Figure 19:
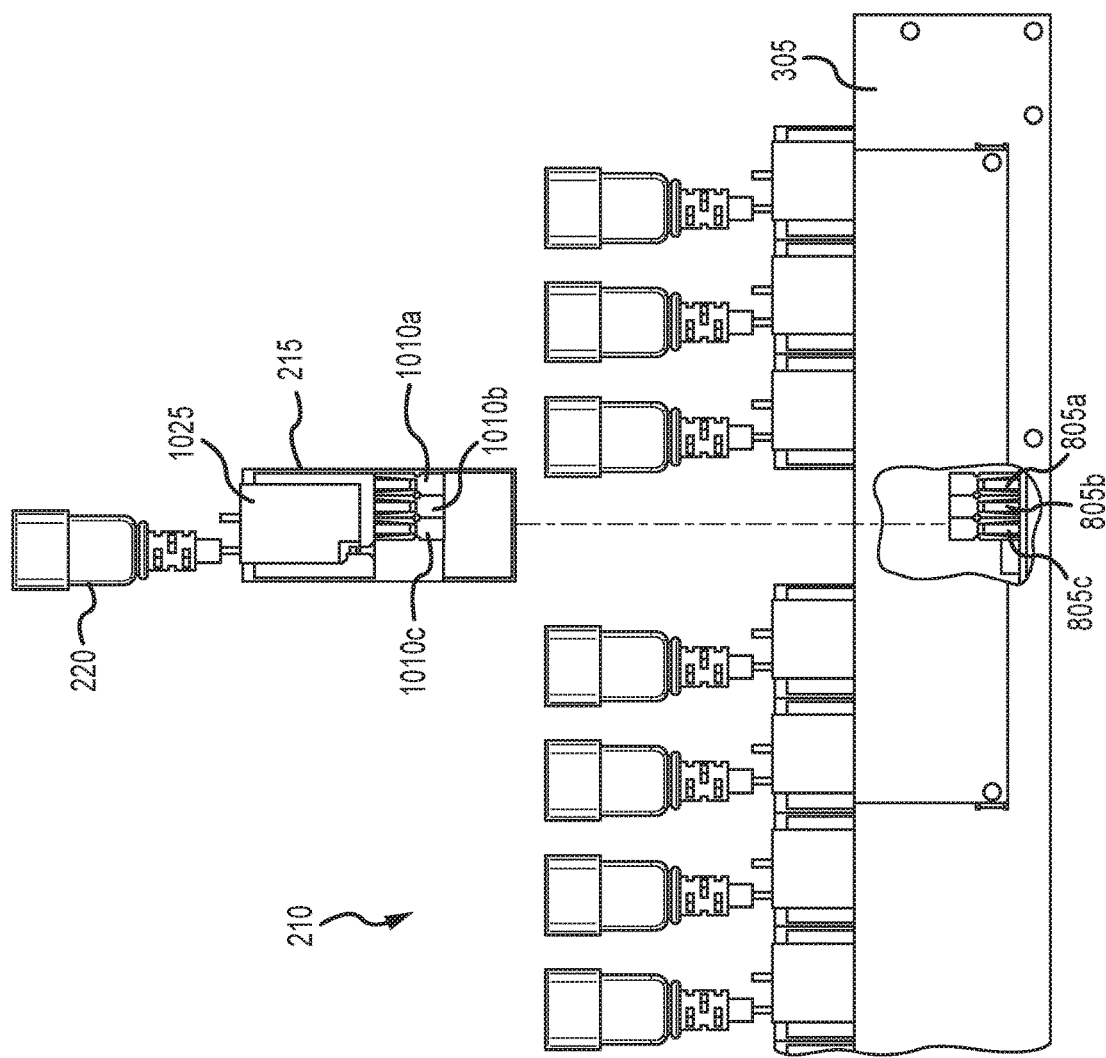
FIG. 19 is a side view of an embodiment of the PDU with a representative cord storage cartridge removed from the PDU, in accordance with various aspects of the present disclosure.

FIG. 19 is a side view of an embodiment of the PDU 210 with a representative cord storage cartridge 215 removed from the PDU 210, in accordance with various aspects of the present disclosure. As shown by the cutaway portion of the PDU housing 305, the power connectors 1010a-1010c of the representative cord storage cartridge 215 aligns with the power connectors 805a-805c of a cartridge interface 405 of the PDU 210.

Figure 20:
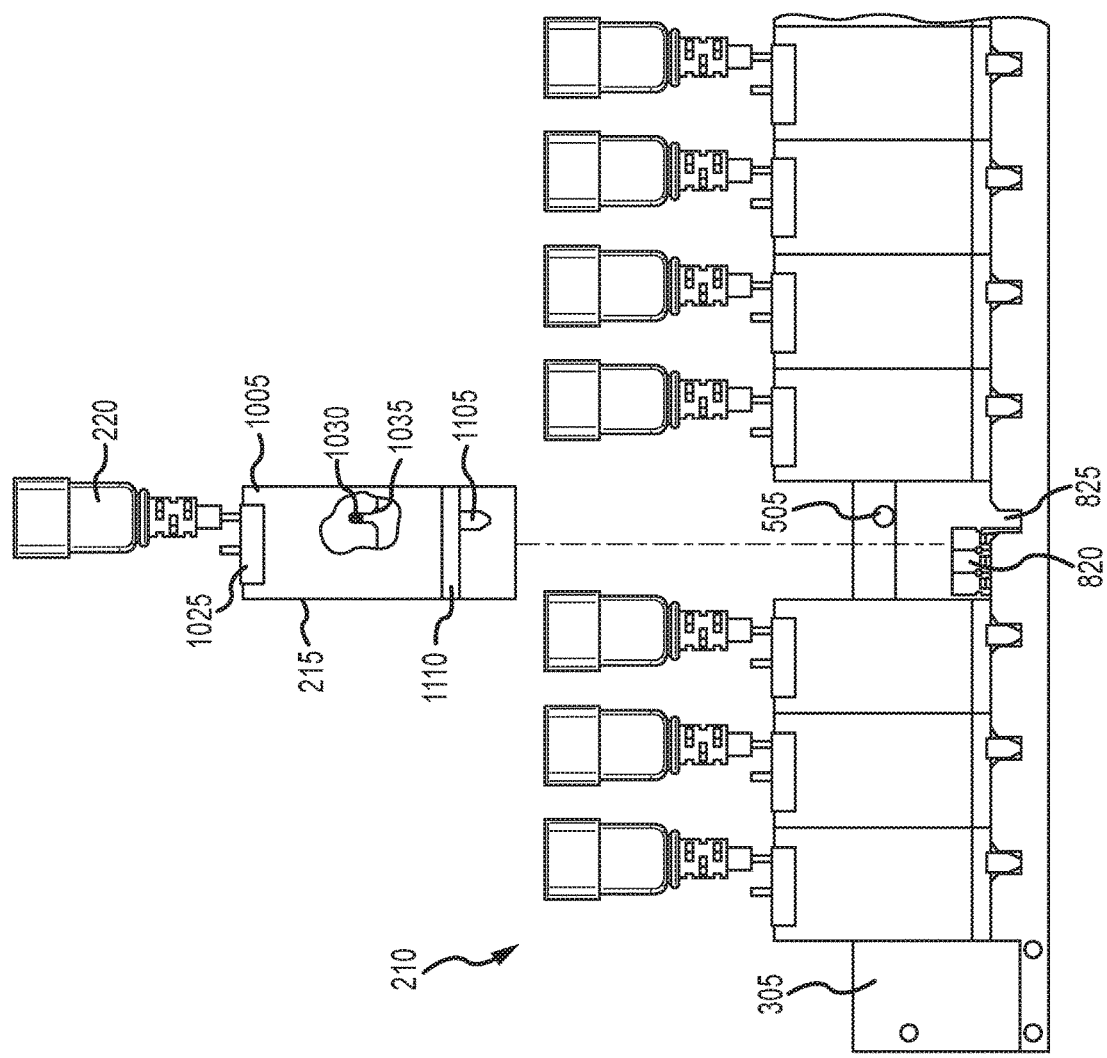
FIG. 20 is an opposing side view of an embodiment of the PDU with a representative cord storage cartridge removed from the PDU, in accordance with various aspects of the present disclosure.

FIG. 20 is an opposing side view of an embodiment of the PDU 210 with a representative cord storage cartridge 215 removed from the PDU 210, in accordance with various aspects of the present disclosure. As shown in FIG. 20, the alignment tab 1105 of the representative cord storage cartridge 215 aligns with the alignment notch 825 in the sidewall 820 of the PDU housing 305. The shelf 1110 of the cord storage cartridge 215 may engage the top of the sidewall 820 of the PDU housing 305 when the cord storage cartridge 215 is connected to the PDU 210.

As shown by the cutaway portion of the cartridge housing 1005, the notch 1030 in the attachment mechanism 1025 and the guide slot 1035 align with the post 505 extending from the PDU housing 305. The guide slot 1035 guides the post 505 into a position where it can be received by the notch 1030. The attachment mechanism 1025 may slide relative to the cartridge housing 1005 between a secured position and an unsecured position. In the secured position, the post 505 is retained by the notch 1030, which fastens the cord storage cartridge 215 to the PDU 210. In the unsecured position, the post 505 may move freely into and out of the guide slot 1035, which may allow the cord storage cartridge 215 to be connected or disconnected from the PDU 210.

Figure 21:
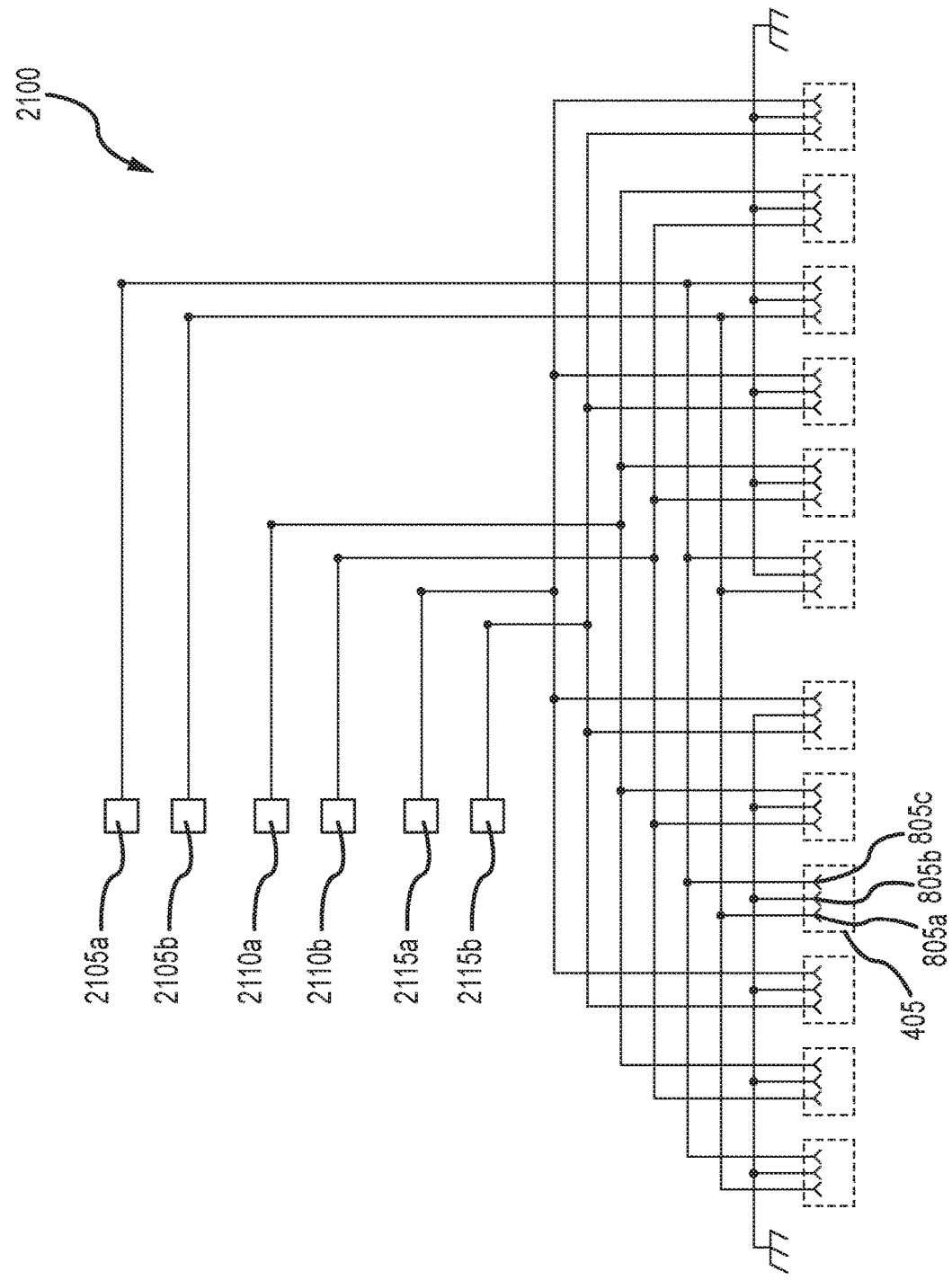
FIG. 21 is a circuit diagram illustrating an example of a multi-phase power distribution circuit, in accordance with various aspects of the present disclosure.

FIG. 21 is a circuit diagram illustrating an example of a multi-phase power distribution circuit 2100, in accordance with various aspects of the present disclosure. The multi-phase power distribution circuit 2100 may be utilized in a PDU, such as PDU 210 described in reference to FIGS. 2-20.

The multi-phase power distribution circuit 2100 includes a first pair of power input nodes 2105a and 2105b, a second pair of power input nodes 2110a and 2110b, and a third pair of power input nodes 2115a and 2115b. Each pair of power input nodes may correspond to a different phase of input power. The power input nodes may correspond to a delta configuration or a wye configuration, which are well-known techniques for distribution of three-phase power.

For example, in the wye configuration, node 2105a may be connected to a first phase of input power, node 2110a may be connected to a second phase of input power, and node 2115a may be connected to a third phase of input power. Nodes 2105b, 2110b, and 2115b may each be connected to a neutral line. In the delta configuration, node 2105a may be connected to a first phase of input power and node 2105b may be connected to a second phase of input power; node 2110a may be connected to the second phase of input power and node 2110b may be connected to a third phase of input power; and node 2115a may be connected to the third phase of input power and node 2115b may be connected to the first phase of input power.

Each pair of power input nodes are electrically interconnected to cartridge interfaces 405 of a PDU. In some embodiments, adjacent cartridge interfaces 405 may be interconnected to different pairs of power input nodes. In this way, adjacent cartridge interfaces may provide different phases of power to connected cord storage cartridges 215. As described in reference to FIG. 8, the cartridge interfaces 405 include three power connectors 805a-805c. Two of the power connectors may be electrically interconnected to a pair of input power nodes, such as power input nodes 2105a-b, 2110a-b, or 2115a-b. The third power connector may be electrically interconnected to ground. For example, power connector 805a may be connected to power input node 2105b, power connector 805b may be connected to ground, and power connector 805c may be connected to power input node 2105a.

Figure 22:
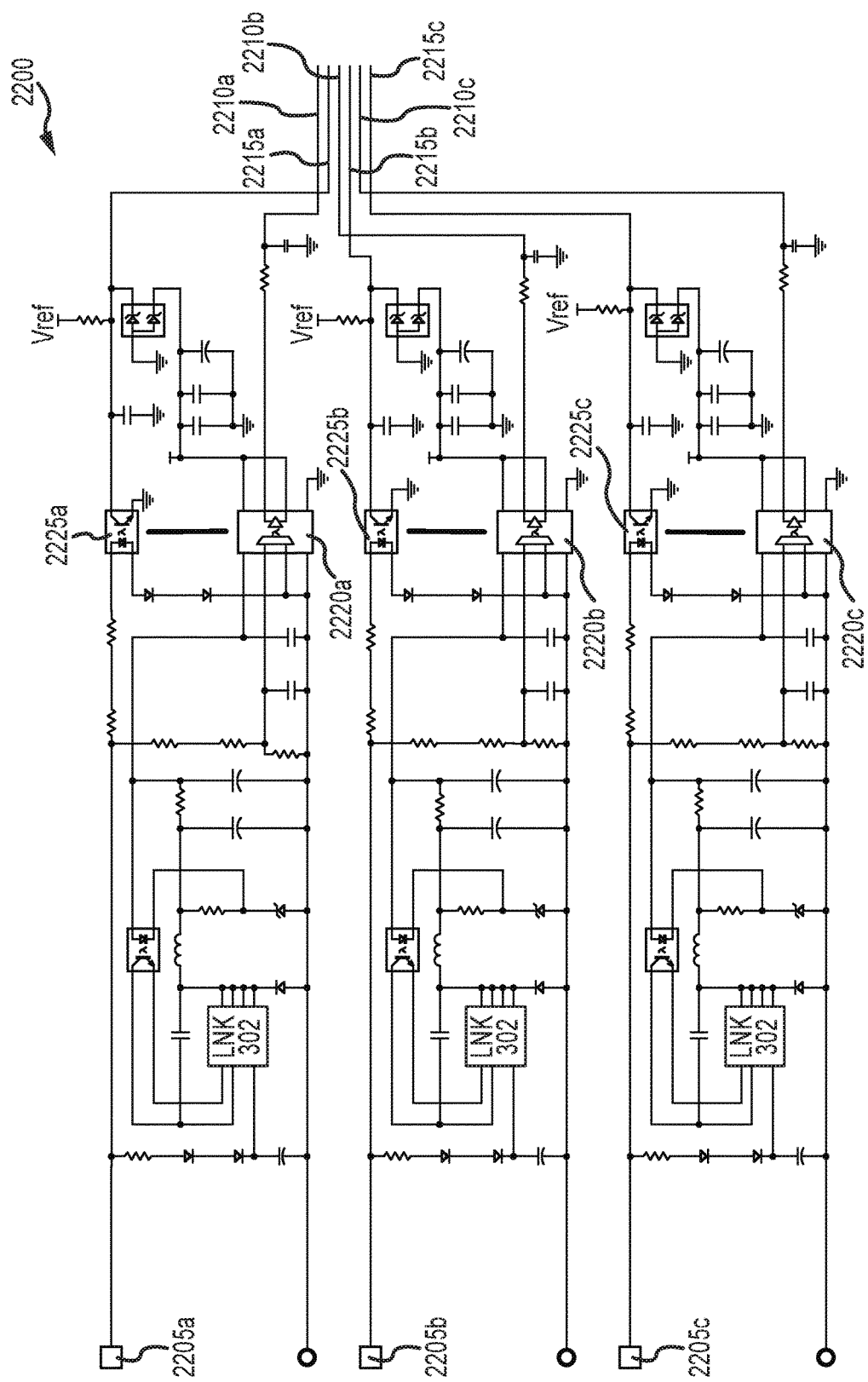
FIG. 22 is a circuit diagram illustrating an example of a voltage sensing circuit, in accordance with various aspects of the present disclosure.

FIG. 22 is a circuit diagram illustrating an example of a voltage sensing circuit 2200, in accordance with various aspects of the present disclosure. The voltage sensing circuit 2200 may be utilized in a PDU, such as PDU 210 described in reference to FIGS. 2-20. Various voltage sensing techniques are well-known in the art. The voltage sensing circuit 2200 is provided as one possible example of how voltage sensing may be accomplished. However, the PDU 210 may utilize other voltage sensing techniques.

The voltage sensing circuit 2200 may include three input nodes 2205a-2205c corresponding to each phase of input power of the PDU. In some embodiments, the input nodes 2205a-2205c may be respectively electrically interconnected with the power input nodes 2105a, 2110a, and 2115a described in reference to FIG. 21.

The voltage sensing circuit 2200 may generate low-level "voltage-sense" signal waveforms which represent the voltage waveforms at the input nodes 2205a-2205c. Isolation devices 2220a-2220c allow these waveforms to be digitized by an A/D converter within a microcontroller (not shown) so that the voltage level of the input nodes 2205a-2205c can be monitored via the voltage sensing circuit 2200. The "voltage-sense" signal waveforms corresponding to each of the input nodes 2205a-2205c are output from the voltage sensing circuit 2200 at voltage-sense output nodes 2210a-2210c.

The voltage sensing circuit 2200 may also generate "on-sense" signals indicating when the voltage signal waveform at each of the input nodes 2205a-2205c are at or near zero volts. Isolation devices 2225a-2225c allow the voltage sensing circuit 2200 to sense when the voltage signal waveform at the input nodes 2205a-2205c are at or near zero volts In some embodiments, the "on-sense" signals are pulse train signals that are at high logic levels when the voltage signal waveforms at the input nodes 2205a-2205c are at or near zero volts. The "on-sense" signals at a low logic level otherwise. The "on-sense" signals corresponding to each of the input nodes 2205a-2205c are output from the voltage sensing circuit 2200 at on-sense output nodes 2215a-2215c.

Figure 23:
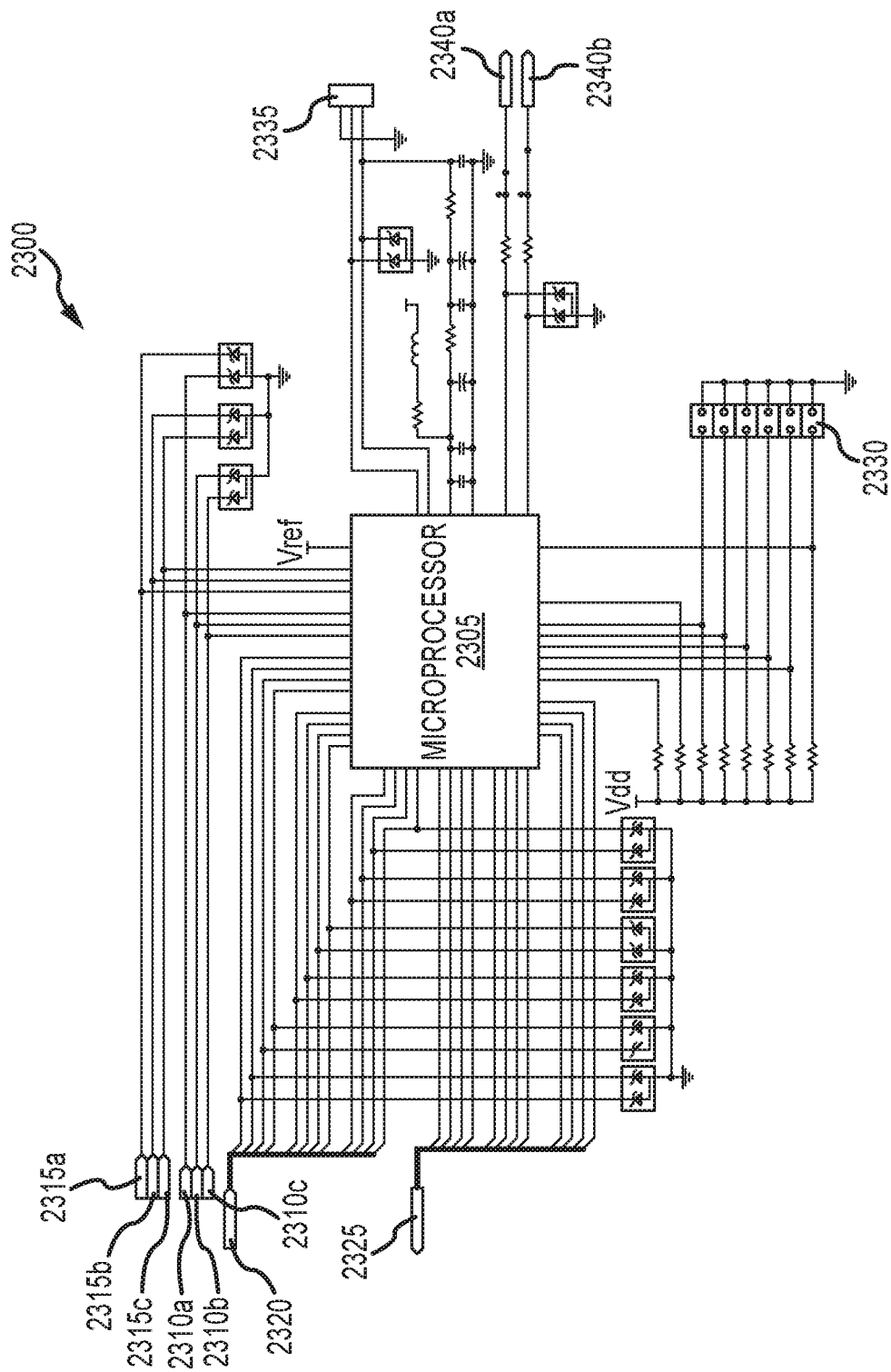
FIG. 23 is a circuit diagram illustrating an example of a control circuit, in accordance with various aspects of the present disclosure.

FIG. 23 is a circuit diagram illustrating an example of a control circuit 2300, in accordance with various aspects of the present disclosure. The control circuit 2300 may be utilized in a PDU, such as the PDU 210 described in reference to FIGS. 2-20.

The control circuit 2300 includes one or more microcontrollers 2305. In one non-limiting example, the microcontroller 2305 may be a C8051F382 microcontroller unit manufactured by Silicon Labs. The microcontroller 2305 may receive "voltage-sense" signals 2310a-2310c and "on-sense" signals 2315a-2315c. The "voltage-sense" signals 2310a-2310c and "on-sense" signals 2315a-2315c may be generated by the voltage sensing circuit 2200 described in reference to FIG. 22. In some embodiments, the "voltage-sense" signal waveforms 2210a-2210c and "on-sense" signals 2215a-2215c shown in FIG. 22 may go through additional filtering and/or buffering circuits before being input as the "voltage-sense" signals 2310a-2310c and "on-sense" signals 2315a-2315c shown in FIG. 23. Each of the "voltage-sense" signals 2310a-2310c and "on-sense" signals 2315a-2315c may correspond to a different phase of input power of the PDU. The microcontroller 2305 may utilize the "on-sense" signals 2315a-2315c to determine the frequency of each different phase of power being input into the PDU. The microcontroller 2305 may utilize the "voltage-sense" signals 2310a-2310c to determine the voltage level of each different phase of power being input into the PDU. In some embodiments, the microcontroller 2305 may determine other power-related parameters associated with the power input based on the "voltage-sense" signals 2310a-2310c and "on-sense" signals 2315a-2315c.

The microcontroller 2305 may also receive "current-sense" signals 2320 from each cord storage cartridge connected to the PDU. In some embodiments, the "current-sense" signals 2320 are received from the communication signal interfaces 1015 of each cord storage cartridge, described in reference to FIG. 10. In some embodiments, the "current-sense" signals received from the communication signal interfaces 1015 may go through additional filtering and/or buffering circuits before being input as the "current-sense" signals 2320 shown in FIG. 23. The microcontroller 2305 may utilize the "current-sense" signals 2320 to determine the amounts of current flowing through the power output cords of each connected cord storage cartridge.

The microcontroller 2305 may transmit relay control signals 2325 to each cord storage cartridge connected to the PDU. In some embodiments, the appropriate relay control signals 2325 are transmitted to the control signal interface 1020 of the cord storage cartridge, as described in reference to FIG. 10. The relay control signals 2325 control the operation of relays present in each connected cord storage cartridge. In some embodiments, the relay control signals 2325 may go through additional filtering and/or buffering circuits before being transmitted over the control signal interface 1020 of a cord storage cartridge. The relay control signals 2325 may switch the relay in a cord storage cartridge between a first state which allows current to flow through the power output cord of the cord storage cartridge, and a second state which prevents current from flowing through the power output cord.

The microcontroller 2305 may communicate with other circuits or devices of the PDU by outputting signals over communication nodes 2340a and 2340b. In some embodiments, the communication nodes 2340a and 2340b may connect to a communications bus of the PDU. In some embodiments, the microcontroller 2305 may utilize the communication nodes 2340a and 2340b to report power-related parameters to the communications module 905 and/or display portion 910 of the PDU, as described in reference to FIG. 9. The power-related parameters may include various sensed parameters, such as the voltage of each different phase of power input to the PDU and/or the current being output by each connected cord storage cartridge.

In some embodiments, the control circuit 2300 may include jumpers 2330 and/or programming pins 2335. The jumpers 2330 and/or programming pins 2335 may be utilized to change various setting of the microcontroller 2305 and/or the PDU. For example, the jumpers 2330 may be utilized to indicate to the microcontroller 2305 how many total cartridge interfaces are present in the PDU and/or what level of voltage each cartridge interface supports.

In some embodiments, the microcontroller 2305 and at least a portion of the control circuit 2300 may be included in a cord storage cartridge. In these embodiments, the PDU may not include a control circuit 2300, or may include one or more alternative control circuits. When the microcontroller 2305 is included in a cord storage cartridge, the microcontroller 2305 may receive the "voltage-sense" signals 2310a-2310c and/or "on-sense" signals 2315a-2315c from the PDU over the communication signal interface 1015 of the cord storage cartridge. The microcontroller 2305 may also receive the "current-sense" signals 2320 directly from a current sensing circuit (as described in FIG. 24) of the cord storage cartridge. The microcontroller 2305 may utilize the "current-sense" signals 2320 to determine the current flowing through the power output cord of the cord storage cartridge, and report the current to the PDU over the communication signal interface 1015. The microcontroller 2305 may also transmit relay control signals 2325 to a relay circuit (as described in FIG. 25) within the cord storage cartridge. The microcontroller 2305 may receive instructions from the PDU over the control signal interface 1020 for changing the state of the relay in the cord storage cartridge, and then translate those instructions into the relay control signals 2325.

Figure 24:
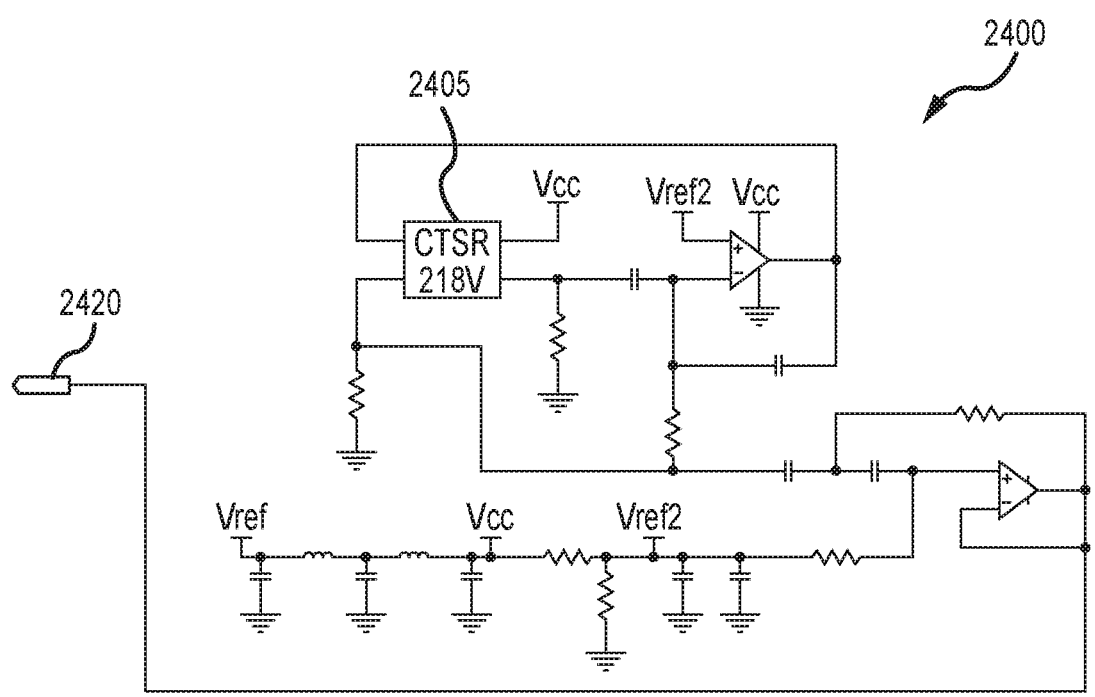
FIG. 24 is a circuit diagram illustrating an example of a current sensing circuit, in accordance with various aspects of the present disclosure.

FIG. 24 is a circuit diagram illustrating an example of a current sensing circuit 2400, in accordance with various aspects of the present disclosure. The current sensing circuit 2400 may be utilized in a cord storage cartridge, such as the cord storage cartridges 215 described in reference to FIGS. 2-20. Various current sensing techniques are well-known in the art. The current sensing circuit 2400 is provided as one possible example of how current sensing may be accomplished. However, the cord storage cartridge 215 may utilize other current sensing techniques.

The current sensing circuit 2400 includes a magneto-resistive sensor device 2405 for sensing the current flowing through a power output cord of a cord storage cartridge. In some examples, the magneto-resistive sensor device 2405 may be a magnetic tunnel junction (MTJ) sensor device, such as device part number CTSR218V manufactured by Crocus Technology. In some embodiments, the magneto-resistive sensor device 2405 and other circuit components of the current sensing circuit 2400 are mounted to the cartridge substrate 1320 of each cord storage cartridge, as described in reference to FIGS. 15-17. In some embodiments, the magneto-resistive sensor device 2405 may be encircled by ferrite shielding to mitigate interfering magnetic fields generated by nearby cord storage cartridges, or other nearby electronic or magnetic devices.

The magneto-resistive sensor device 2405 is configured to determine and/or otherwise measure the strength of a proximate alternating magnetic field that is associated with a power output cord of each cord storage cartridge. Based on the measured magnetic field, the current sensing circuit 2400 outputs a "current-sense" signal 2420 indicative of the current flowing through the power output cord of the cord storage cartridge. In some examples, the current sensing circuit 2400 may utilize other circuit configurations, such as those described in U.S. application Ser. No. 14/959,207, entitled "Magneto-Resistive Sensor Device and Magnetic Bias Regulator Circuit, Along With Systems And Methods Incorporating Same," filed on Dec. 4, 2015, which is incorporated by reference herein in its entirety.

The "current-sense" signal 2420 generated by the current sensing circuit 2400 may be output through the communication signal interface 1015 of the cord storage cartridge, as described in reference to FIG. 10. The PDU to which the cord storage cartridge is connected may then receive the "current-sense" signal 2420 and utilize it for reporting the current flowing through the corresponding power output cord, as described in reference to FIG. 23.

Figure 25:
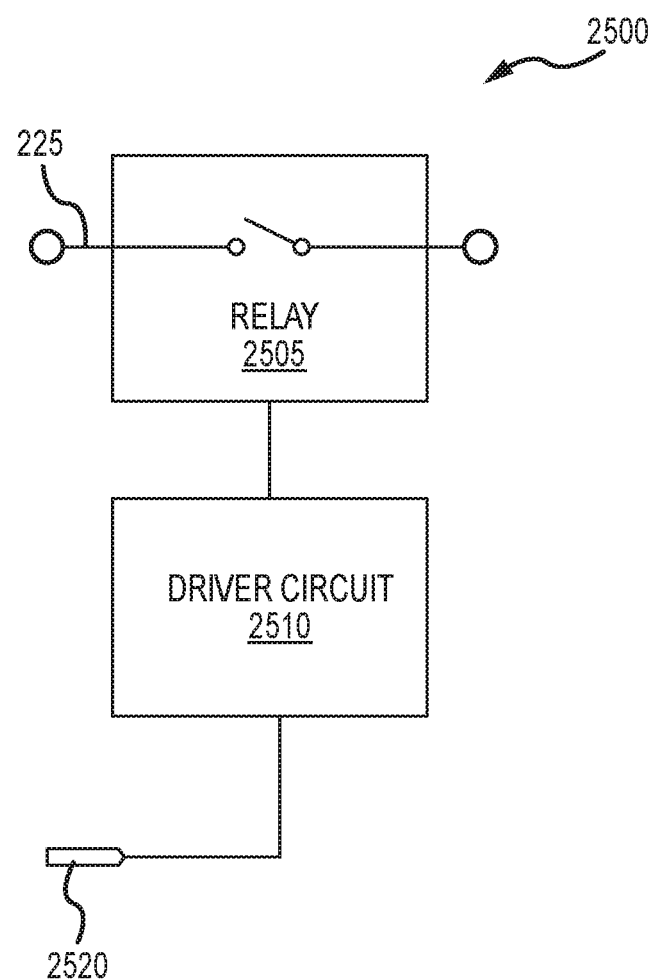
FIG. 25 is a circuit diagram illustrating an example of a relay circuit, in accordance with various aspects of the present disclosure.

FIG. 25 is a circuit diagram illustrating an example of a relay circuit 2500, in accordance with various aspects of the present disclosure. The relay circuit 2500 may be utilized in a cord storage cartridge, such as the cord storage cartridges 215 described in reference to FIGS. 2-20.

The relay circuit 2500 includes a relay 2505 which controls the flow of current through a power output cord 225 of a cord storage cartridge. The relay 2505 may be a basic electromagnetic relay, a latching relay, or other type of electronic switching device. The relay 2505 switches between a first state which allows current to flow through the power output cord 225, and a second state which prevents current from flowing through the power output cord 225. The state of the relay 2505 is controlled by a driver circuit 2510. The driver circuit 2510 receives a relay control signal 2520 from a microcontroller in the PDU or cord storage cartridge. In response to the relay control signal 2520, the driver circuit 2510 provides one or more signals which control the state of the relay 2505.

Figure 26:
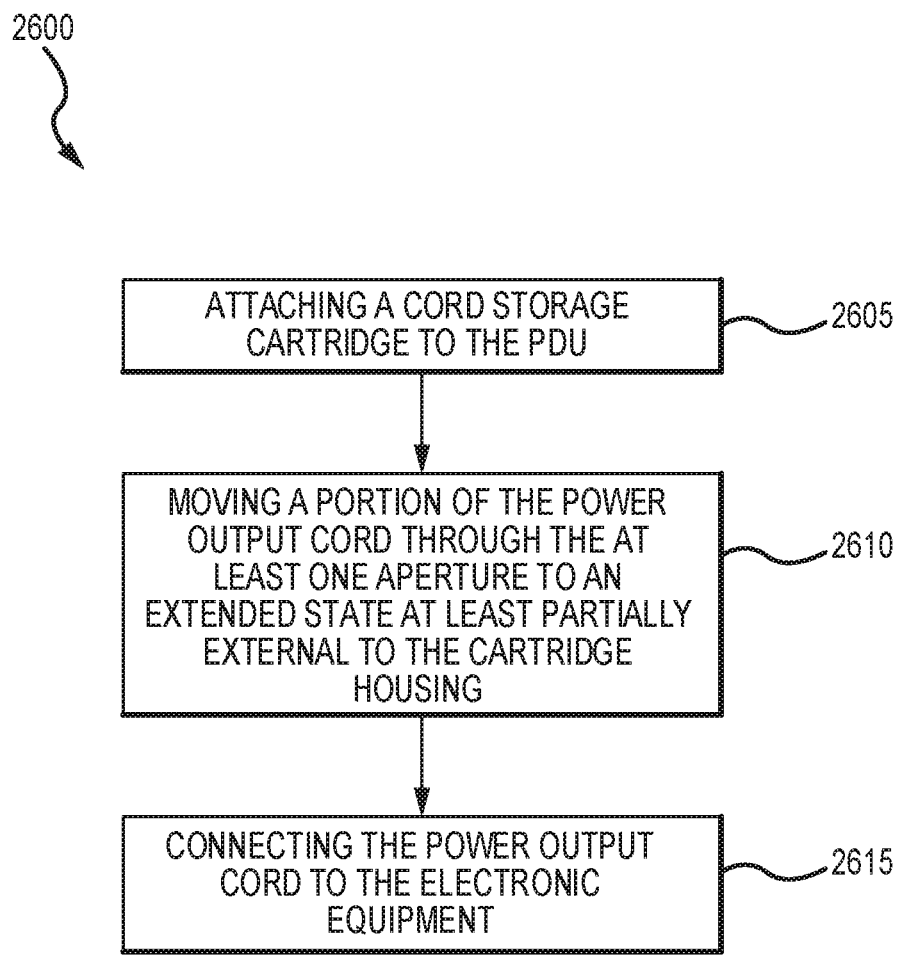
FIG. 26 is a flow diagram of an example method for supplying power from a PDU to electronic equipment, in accordance with various aspects of the present disclosure.

FIG. 26 is a flow diagram of an example method 2600 for supplying power from a PDU to electronic equipment, in accordance with various aspects of the present disclosure. The PDU may be the PDU 210, including at least one cord storage cartridge 215, as described in reference to FIGS. 2-25.

At step 2605, the method 2600 includes attaching a cord storage cartridge to the PDU. The cord storage cartridge may include a cartridge housing having at least one aperture and a power output cord stowed at least partially within the cartridge housing in a retracted state. In some examples, the cord storage cartridge may be connected to a cartridge interface of the PDU. In some examples, the cord storage cartridge may be removably fastened to the PDU with an attachment mechanism.

At step 2610, the method 2600 includes moving a portion of the power output cord through the at least one aperture to an extended state at least partially external to the cartridge housing.

At step 2615, the method 2600 includes connecting the power output cord to the electronic equipment.

The method 2600 may include additional acts, omit some acts, and/or may perform the acts in a different order than set out in the FIG. 26.

Embodiments described herein provide several benefits relative to traditional PDUs. By connecting a number of cord storage cartridges to the PDU corresponding to the amount of electronic equipment requiring power from the PDU, the space occupied by the PDU and associated power output cords may be reduced. In addition, the locations where the cord storage cartridges are connected to the PDU may be selected such that distance to from the cord storage cartridge to a particular electronic equipment is reduced. This may allow for better airflow into and out of the equipment rack, and may allow the connections of the power output cords to the electronic equipment to be more easily managed. Furthermore, cord storage cartridges having different types of output connectors may be connected to the PDU. This may allow various electronic equipment requiring different power connectors to receive power from the PDU. It will be noted that this list of various advantages is not exhaustive or exclusive, and numerous different advantages and efficiencies may be achieved, as will be recognized by one of skill in the art.

It should be noted that the systems, methods, and devices discussed above are intended merely to be examples. It must be stressed that various embodiments may omit, substitute, or add various procedures or components as appropriate. For instance, it should be appreciated that, in alternative embodiments, features described with respect to certain embodiments may be combined in various other embodiments. Different aspects and elements of the embodiments may be combined in a similar manner. Also, it should be emphasized that technology evolves and, thus, many of the elements are exemplary in nature and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, structures, and techniques have been shown without unnecessary detail in order to avoid obscuring the embodiments.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

We claim:

1. A power distribution unit (PDU), comprising:
an elongate PDU housing substantially enclosing an interior and including one or more channels separated from and extending longitudinally along a lateral side of the interior, said one or more channels having a combined length at least half the length of the PDU housing;
a power input coupled with the PDU housing and connectable to an external power source;
at least one cord storage cartridge removably connected to the PDU and in electrical communication with the power input; and
a plurality of cartridge interfaces associated with the PDU housing each configured to removably connect the at least one cord storage cartridge to the PDU, wherein at least one of the plurality of cartridge interfaces includes one or more connectors extending toward the at least one cord storage cartridge.

2. The PDU of claim 1, wherein the at least one cartridge interface is further configured to electrically interconnect the at least one cord storage cartridge to the power input.

3. The PDU of claim 2, wherein the at least one cartridge interface comprises:
at least one first power connector in electrical communication with a first power line from the power input; and
at least one second power connector in electrical communication with a second power line from the power input.

4. The PDU of claim 3, wherein the first power line is a first phase power line from the power input, and the second power line is a neutral line from the power input.

5. The PDU of claim 3, wherein the power input is a polyphase power input, the first power line is a first phase power line from the polyphase power input, and the second power line is a second phase power line from the polyphase power input.

6. The PDU of claim 1, wherein the at least one cartridge interface comprises:
at least one communication signal interface configured to receive at least one power-related parameter from the at least one cord storage cartridge.

7. The PDU of claim 6, wherein the at least one communication signal interface comprises an electrical signal interface, an optical signal interface, a radio frequency signal interface, or a combination thereof.

8. The PDU of claim 6, wherein the at least one cord storage cartridge comprises at least one sensing device configured to sense the at least one power-related parameter.

9. The PDU of claim 6, further comprising:
at least one communications bus in communication with the at least one communication signal interface; and
at least one communications module in communication with the at least one communications bus and configured to report the at least one power-related parameter to a network.

10. The PDU of claim 1, wherein the at least one cartridge interface comprises:
at least one control signal interface configured to provide control signals to the at least one cord storage cartridge.

11. The PDU of claim 10, wherein the at least one control signal interface comprises an electrical signal interface, an optical signal interface, a radio frequency signal interface, or a combination thereof.

12. The PDU of claim 10, wherein the control signals control the operation of the at least one cord storage cartridge.

13. The PDU of claim 10, wherein the at least one cord storage cartridge comprises at least one relay and the control signals control the operation of the at least one relay.

14. The PDU of claim 1, wherein the one or more channels comprises a sidewall having at least one alignment notch configured to guide the at least one cord storage cartridge into registration with the at least one cartridge interface.

15. The PDU of claim 1, further comprising:
a plurality of cord storage cartridges disposed adjacent to each other along a substantial length of the PDU housing.

16. The PDU of claim 15, wherein each of the plurality of cord storage cartridges comprises a power output cord having a proximal end in electrical communication with the power input and a distal end coupled with an output connector that is configured to connect to electronic equipment.

17. The PDU of claim 16, wherein two or more of the plurality of cord storage cartridges comprise power output cords having different types of output connectors configured to connect to corresponding types of electronic equipment.

18. The PDU of claim 15, wherein two or more of the plurality of cord storage cartridges are interchangeable.

19. The PDU of claim 1, further comprising:
at least one cartridge attachment structure associated with the PDU housing; and
at least one PDU attachment mechanism associated with the at least one cord storage cartridge and configured to mateably engage with the at least one cartridge attachment structure.

20. The PDU of claim 19, wherein the at least one cartridge attachment structure comprises a post and the at least one PDU attachment mechanism comprises a notch configured to receive the post.

21. A power distribution unit (PDU), comprising:
an elongate PDU housing substantially enclosing an interior and including one or more channels separated from and extending longitudinally along a lateral side of the interior, said one or more channels having a combined length at least half the length of the PDU housing;
a power input coupled with the PDU housing and connectable to an external power source;
a plurality of cord storage cartridges each disposed in the one or more channels and removably connected to the PDU and in electrical communication with the power input; and
a plurality of cartridge interfaces associated with the PDU housing and configured to removably connect the plurality of cord storage cartridges to the PDU, wherein at least one of the plurality of cartridge interfaces includes one or more connectors extending toward the at least one cord storage cartridge.

22. A power distribution unit (PDU), comprising:
an elongate PDU housing substantially enclosing an interior and including one or more channels separated from and extending longitudinally along a lateral side of the PDU housing interior, said one or more channels having a combined length at least half the length of the PDU housing;
a power input coupled with the PDU housing and connectable to an external power source; and
a plurality of interchangeable cord storage cartridges, each disposed in the channel and removably connected to the PDU and in electrical communication with the power input.

23. The PDU of claim 22, further comprising a plurality of cartridge interfaces associated with the PDU housing and configured to removably connect the plurality of cord storage cartridges to the PDU.

24. The PDU of claim 22, wherein the interior and the one or more channels share a common wall.

* * * * *